(12) United States Patent
Matsui et al.

(10) Patent No.: US 11,194,106 B2
(45) Date of Patent: Dec. 7, 2021

(54) OPTICAL TRANSCEIVER

(71) Applicant: Sumitomo Electric Industries, Ltd., Osaka (JP)

(72) Inventors: Takashi Matsui, Osaka (JP); Hiromi Kurashima, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/806,056

(22) Filed: Mar. 2, 2020

(65) Prior Publication Data

US 2020/0285006 A1 Sep. 10, 2020

(30) Foreign Application Priority Data

Mar. 7, 2019 (JP) .............. JP2019-041410

(51) Int. Cl.
*G02B 6/42* (2006.01)
*H04B 10/40* (2013.01)
*H05K 7/20* (2006.01)
*H05K 9/00* (2006.01)

(52) U.S. Cl.
CPC ......... *G02B 6/4268* (2013.01); *G02B 6/4246* (2013.01); *G02B 6/4261* (2013.01); *H04B 10/40* (2013.01); *H05K 7/20145* (2013.01); *H05K 9/0058* (2013.01)

(58) Field of Classification Search
CPC .. G02B 6/4268; G02B 6/4246; G02B 6/4261; H04B 10/40; H05K 7/20145; H05K 9/0058
See application file for complete search history.

(56) References Cited

U.S. PATENT DOCUMENTS

| 6,171,357 | B1 * | 1/2001 | Guttmann | .............. | B01D 46/10 |
| | | | | | 55/385.7 |
| 8,939,658 | B2 * | 1/2015 | Heimbuch | ............... | G02B 6/36 |
| | | | | | 385/92 |
| 2017/0168253 | A1 * | 6/2017 | Wilcox | ................ | G02B 6/4277 |
| 2017/0285282 | A1 * | 10/2017 | Regnier | ............... | G02B 6/3897 |

* cited by examiner

*Primary Examiner* — Mukundbhai G Patel
(74) *Attorney, Agent, or Firm* — Baker Botts L.L.P.; Michael A. Sartori

(57) ABSTRACT

An optical transceiver according to an aspect of the present embodiment is an optical transceiver configured to be inserted to and extracted from a cage of an apparatus along a first direction. The optical transceiver includes a device generating heat, and a housing having a rectangular parallelepiped shape with long sides extending along the first direction. The housing includes an internal space housing the device, and an outside part configured to be exposed to an outside of the cage. When the housing is engaged with the cage, the outside part having an air intake part configured to bring an outside air into the internal space for cooling the device.

9 Claims, 21 Drawing Sheets

OPTICAL TRANSCEIVER

TECHNICAL FIELD

An aspect of the present disclosure relates to an optical transceiver.

BACKGROUND

U.S. Unexamined Patent Publication No. 2017/0168253 discloses an optical transceiver that converts an electrical signal into an optical signal and converts an optical signal into an electrical signal, and is inserted into or removed from a cage of a host system. The optical transceiver includes a circuit board. At one of two ends of the circuit board, a receptacle is disposed and receives an outside optical connector. At the other end of the circuit board, an electrical plug is disposed and is electrically connected with an electrical connector within the host system. The optical transceiver further includes a heat sink disposed on the circuit board, and a housing that covers the circuit board and the heat sink.

The heat sink is a platelike component disposed between the circuit board and an internal surface of the housing. The heat sink is tightly in contact with the internal surface of the housing. The heat sink dissipates heat generated at the circuit board to outside the optical transceiver. The heat sink is made of a material that has a high thermal conductivity, such as aluminum or copper. The heat sink has a plurality of grooves that extend along an axis along which the optical transceiver is inserted into or removed from the cage. The plurality of grooves constitute a heat dissipating part. Therefore, heat generated at the circuit board and the like is dissipated through the plurality of grooves of the heat dissipating part. Consequently, heat is dissipated from the optical transceiver.

SUMMARY

An optical transceiver according to an aspect of the present disclosure is an optical transceiver configured to be inserted to and extracted from a cage of an apparatus along a first direction. The optical transceiver includes a device generating heat, and a housing having a rectangular parallelepiped shape with long sides extending along the first direction. The housing includes an internal space housing the device, and an outside part configured to be exposed to an outside of the cage. When the housing is engaged with the cage, the outside part having an air intake part configured to bring an outside air into the internal space for cooling the device.

DETAILED DESCRIPTION

Details of Embodiments

Hereinafter, specific examples of optical transceivers according to embodiments will be described with reference to the drawings. It is intended that the present invention is not limited to the following examples but is shown in the claims. Further, it is intended that the present invention includes all modifications within a scope of claims and a scope of equivalents of the claims. To explain the drawings, same reference signs are assigned to same or corresponding components and redundant explanations thereof will be appropriately omitted.

First Embodiment

Figure 1:
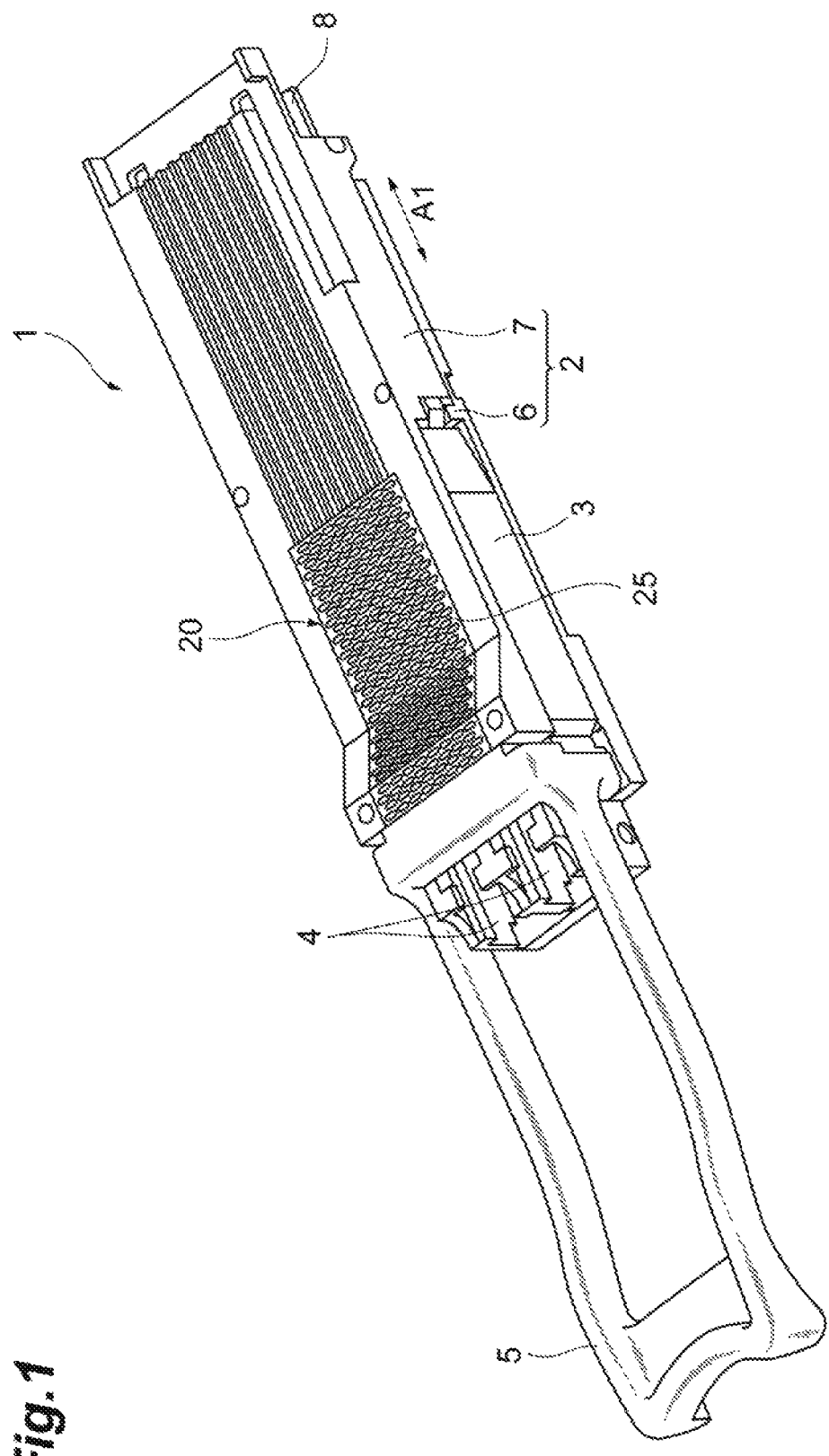
FIG. 1 is a perspective view that illustrates an optical transceiver according to a first embodiment of the present disclosure.
Figure 2:
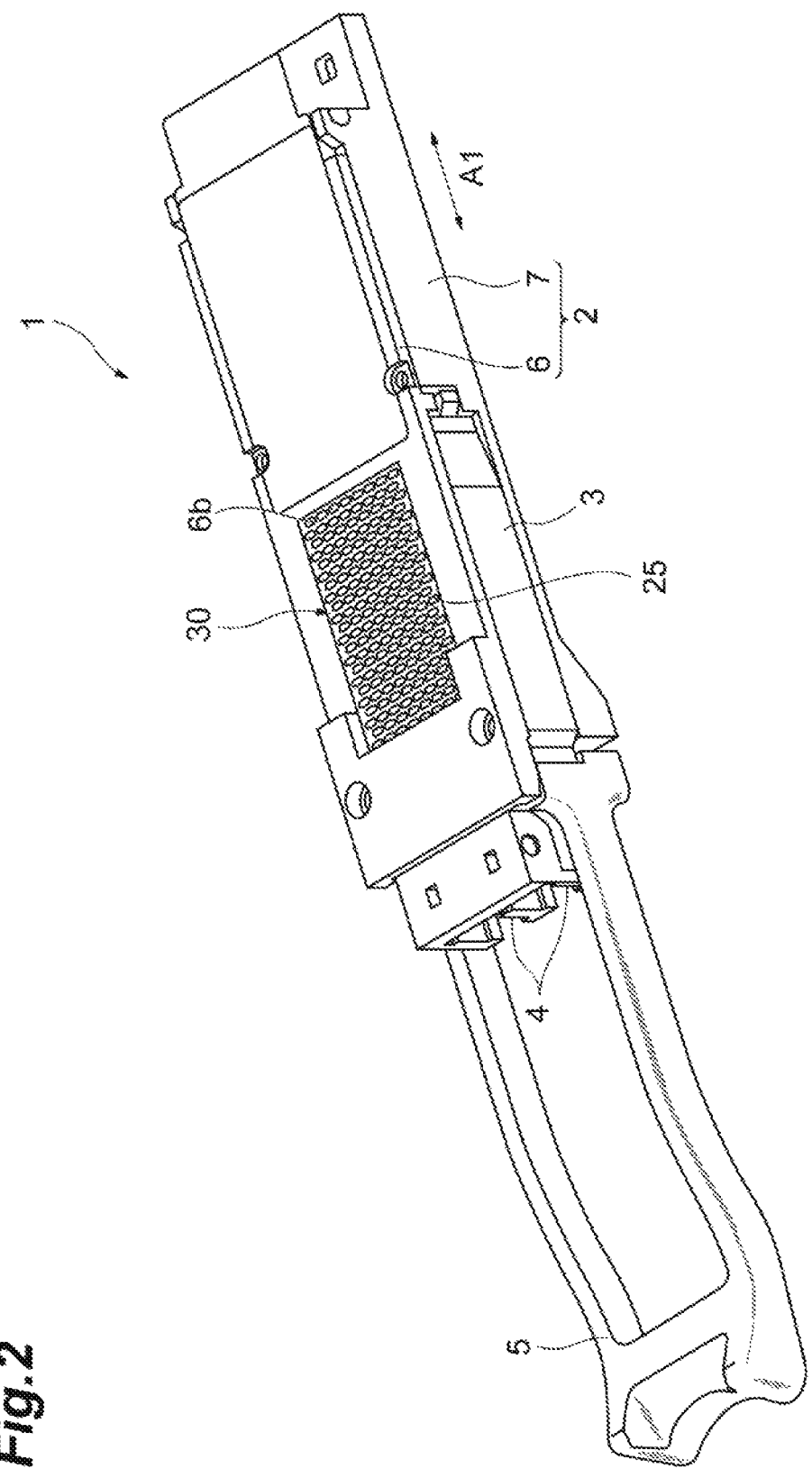
FIG. 2 is a perspective view of an opposite side of the optical transceiver in FIG. 1.

FIG. 1 is a perspective view that illustrates an optical transceiver 1 according to a first embodiment of the present disclosure. FIG. 2 is a perspective view of an opposite side of the optical transceiver 1 in FIG. 1. The optical transceiver 1 is an optical transceiver that complies with specifications for small form-factor pluggable (SFP), for example. The optical transceiver 1 is full-duplex. For example, the optical transceiver 1 is what is called a pluggable optical transceiver. More specifically, the optical transceiver 1 is a hot-pluggable transceiver that can be activated by attaching the optical transceiver 1 to a communication device (apparatus) without shutting down the communication device. The communication device is a host system, for example.

As illustrated in FIGS. 1 and 2, the optical transceiver 1 includes a housing 2 made of metal, sliders 3 slidable relative to the housing 2, an optical receptacle 4 that is at one of two ends of the housing 2, and a handle 5 that extends from the housing 2. The housing 2 includes a lower housing 6 and an upper housing 7 that is opposite the lower housing 6. The sliders 3 are between the lower housing 6 and the upper housing 7.

The upper housing 7 includes a mesh member 20 through which air is sucked into an internal space of the optical transceiver 1. The lower housing 6 includes a mesh member (air intake part) 30 that is similar to the mesh member (air intake part) 20. The mesh member 20 and the mesh member 30 will be described in detail later. The sliders 3 are at both sides of the housing 2. The housing 2 includes an electrical plug 8 connected with an electrical connector that is within a cage C of the communication device (see FIG. 3). The electrical plug 8 is opposite the optical receptacle 4. In the following explanations, a side on which the optical receptacle 4 exists may be referred to as a front, and a side on which the electrical plug 8 exists may be referred to as a rear.

The optical receptacle 4 is at one of two ends of the housing 2 that extends along a first axis (first direction) A1 that is an axis along which the housing 2 is inserted into or removed from the cage C. Optical connectors are inserted into or removed from the optical receptacle 4. The optical connectors are not illustrated and are provided at distal ends of two optical-fiber cables. The optical connectors of the two optical-fiber cables are inserted into the optical receptacle 4. Consequently, an electrical circuit within the housing 2 can communicate with the optical-fiber cables. The handle 5 is made of resin, and is made of a flexible material. The handle 5 may be referred to as a pull tab. The handle 5 cooperates with the sliders 3 and extends from the housing 2 along the first axis A1.

Figure 3:
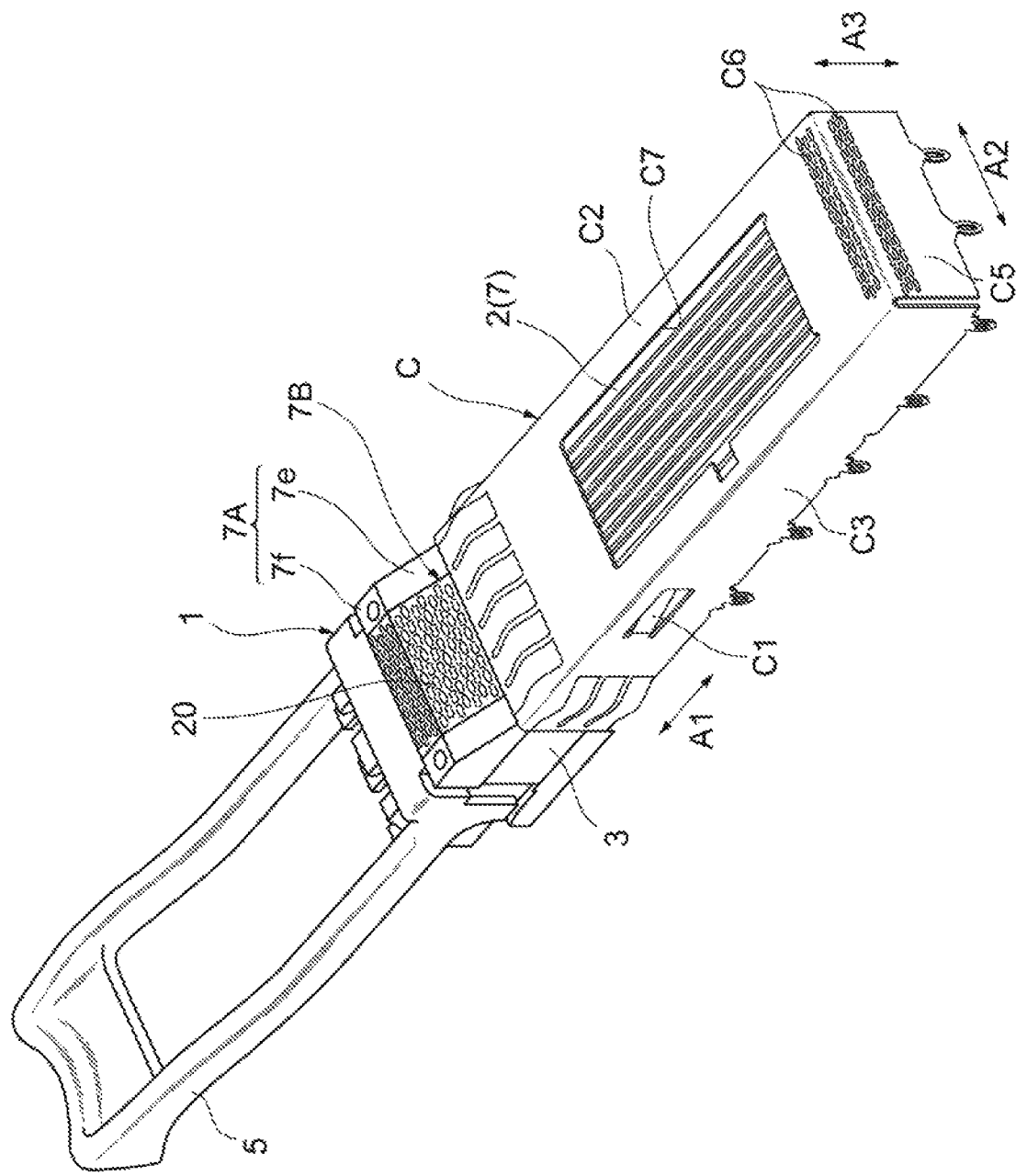
FIG. 3 is a perspective view that illustrates the optical transceiver in FIG. 1 and a cage.
Figure 4:
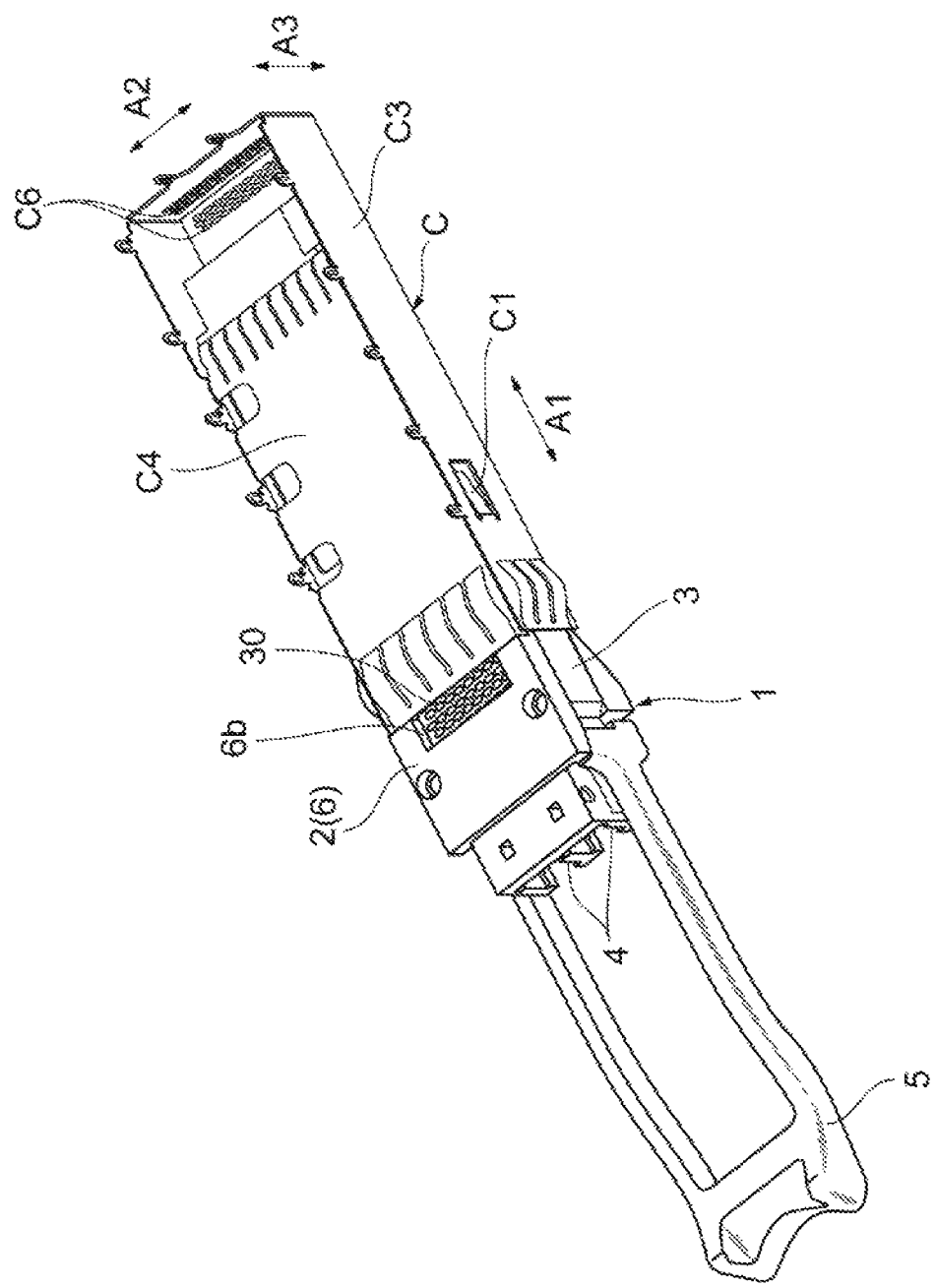
FIG. 4 is a perspective view of opposite sides of the optical transceiver and the cage in FIG. 3.

FIG. 3 is a perspective view that illustrates the optical transceiver 1 and the cage C of the communication device. FIG. 4 is a perspective view of an opposite side of the optical transceiver 1 and an opposite side of the cage C in FIG. 3. To use the optical transceiver 1, the optical transceiver 1 is inserted into or removed from the cage C of the communication device along the first axis A1. The housing 2 of the optical transceiver 1 is inserted into or removed from the cage C. The housing 2 extends along the first axis A1 that is an axis along which the optical transceiver 1 is inserted into or removed from the cage C.

The cage C has a rectangular parallelepiped shape and extends along the first axis A1. The cage C has a top surface C2 that extends along the first axis A1 and an axis A2, a pair of side surfaces C3 that each extend along the first axis A1 and an axis A3 that is a height axis, a bottom surface C4 that is opposite the top surface C2, and a rear surface C5 that is opposite a receiving opening of the cage C that receives the housing 2. When the housing 2 is inserted into the cage C and reaches a predetermined position, the housing 2 of the optical transceiver 1 is engaged with the cage C. The pair of side surfaces C3 of the cage C each face along the axis A2. The pair of side surfaces C3 each has a cage tab C1 that is engageable with the housing 2. The above sliders 3 function as a mechanism that engages the housing 2 with the cage tabs C1 of the cage C or disengages the housing 2 from the cage tabs C1 of the cage C.

The housing 2 engaged with the cage tabs C1 is not easily pulled out from the cage C even if the housing 2, for example, is directly held and pulled. When the housing 2 is pulled with the handle 5, the sliders 3 slide relative to the housing 2 and disengage the housing 2 from the cage tabs C1. Consequently, the housing 2 is pulled out from the cage C. When the handle 5 is pulled in a direction away from the cage C, the sliders 3 move together with the handle 5. The movement of the sliders 3 disengages the housing 2 from the cage tabs C1.

The cage C has a plurality of through holes C6 and an opening C7. The plurality of through holes C6 are at a rear side of the top surface C2, and are at a portion of the rear surface C5 that is close to the top surface C2. The opening C7 is at an area of the top surface C2 where a center of the top surface C2 exists. The plurality of through holes C6 release heat within the cage C to outside the cage C. Each of the through holes C6 is elliptical and extends along the axis A2 that is a width axis of the housing 2. The plurality of through holes C6 align along the axis A2 in the top surface C2 and the rear surface C5. A fan (not illustrated) is disposed within the communication device, and sucks air into the cage C through the receiving opening of the cage C. The fan that is rotating generates air flow that sucks air into the cage C through the receiving opening of the cage C.

In the top surface C2, groups of the plurality of through holes C6 that align along the axis A2 are arranged along the first axis A1. In the rear surface C5, groups of the plurality of through holes C6 that align along the axis A2 are arranged along the axis A3. The opening C7, in the top surface C2, is rectangular, and extends along the first axis A1. The opening C7 exposes part of the housing 2 (upper housing 7) from the cage C. Further, a heat sink is disposed in the opening C7. Through the opening C7, heat is dissipated from the housing 2 to outside the cage C.

Figure 5:
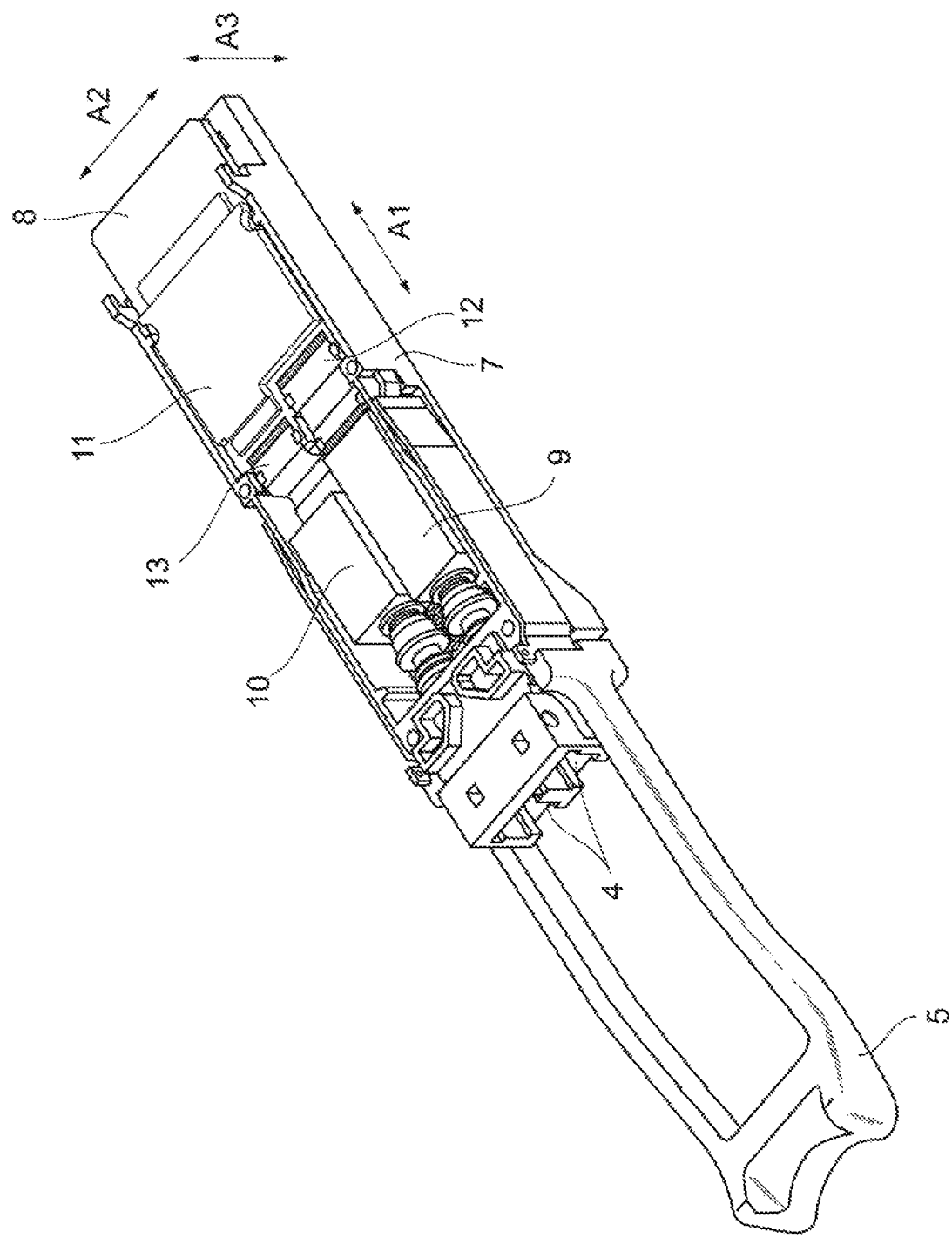
FIG. 5 is a perspective view that illustrates an internal configuration of the optical transceiver in FIG. 1.

FIG. 5 is a perspective view that illustrates the optical transceiver 1 in FIG. 2 from which the lower housing 6 is removed. As illustrated in FIG. 5, the housing 2 houses a transmitter optical sub-assembly (TOSA) 9, a receiver optical sub-assembly (ROSA) 10, a circuit board 11, and flexible print circuits (FPCs) 12 and 13. The TOSA 9 and the ROSA 10 are arranged along the axis A2, and are close to each other. The TOSA 9 includes, for example, a light emitting element, such as a semiconductor laser, and converts an electrical signal into an optical signal. The ROSA 10 includes, for example, a light receiving element, such as a photodetector, and converts an optical signal into an electrical signal. The FPC 12 electrically connects the TOSA 9 with the circuit board 11. The FPC 13 electrically connects the ROSA 10 with the circuit board 11.

The ROSA 10 converts an optical signal that the optical transceiver 1 has received from outside the optical transceiver 1 into an electrical signal. The electrical signal is transmitted to the circuit board 11 through the FPC 13. The circuit board 11 includes circuits, such as a circuit for clock data recovery (CDR), for example. The circuits of the circuit board 11 process the electrical signal. The electrical signal that has been processed is output to the communication device through the electrical plug 8. On the other hand, an electrical signal for transmission is input into the circuit board 11 from the communication device through the electrical plug 8. The electrical signal is processed by the circuits of the circuit board 11, and then is transmitted to the TOSA 9 through the FPC 12. The TOSA 9 converts the electrical signal into an optical signal, and then transmits the optical signal to outside the optical transceiver 1.

Figure 6:
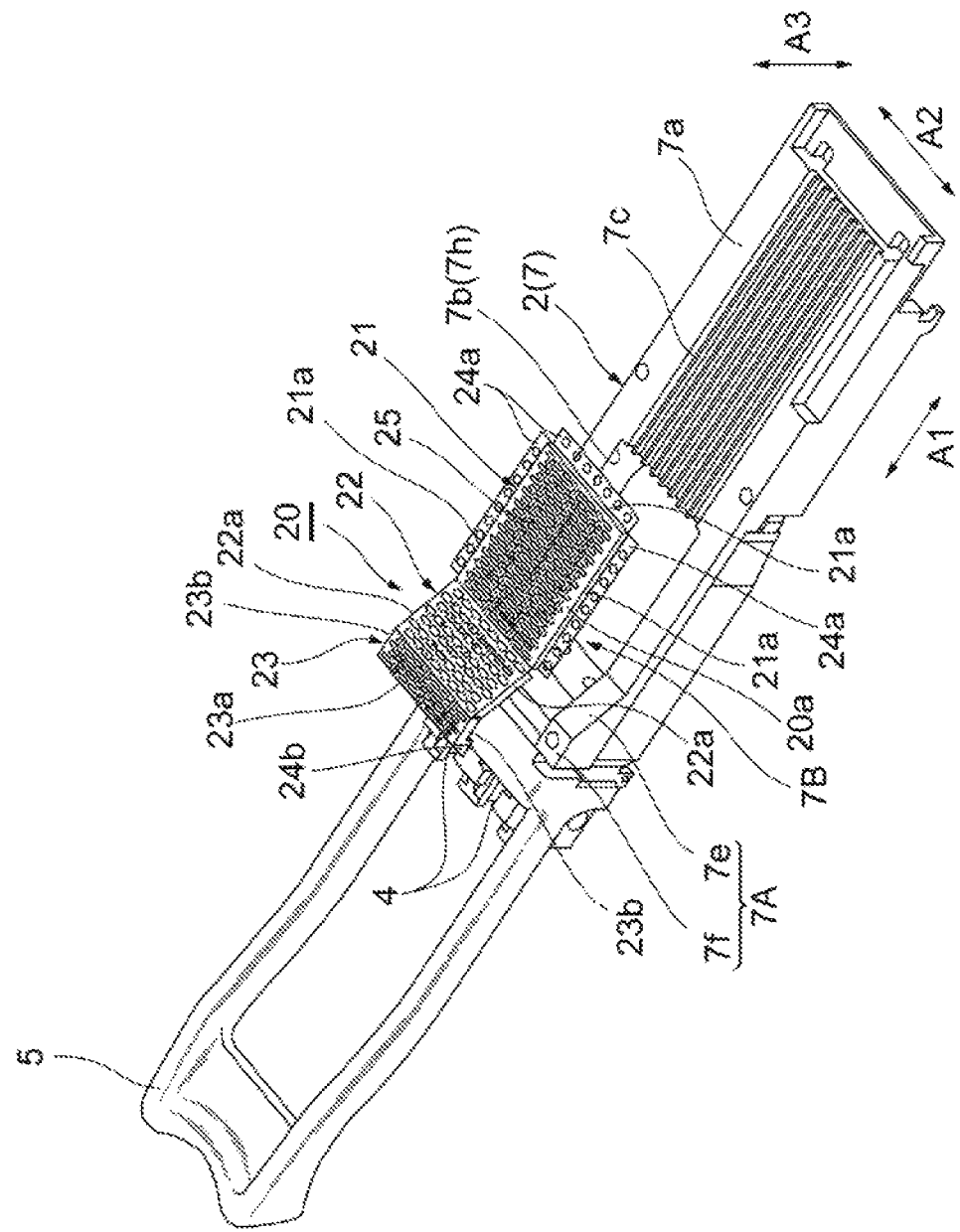
FIG. 6 is a perspective view that illustrates a housing of the optical transceiver in FIG. 1 and a mesh member.

FIG. 6 is a perspective view that illustrates the housing 2 (upper housing 7), and the mesh member 20 that is attached to the housing 2 and has a platelike shape. As described above, the mesh member 20 is attached to the upper housing 7, and the mesh member 30 is attached to the lower housing 6. A configuration of the mesh member 30 is similar to a configuration of the mesh member 20. Therefore, hereinafter, explanations for the mesh member 30 will be appropriately omitted to avoid redundancy.

The mesh member 20 has a plurality of through holes 25 arranged along both the first axis A1 and the axis A2. The plurality of through holes 25 are arranged in a mesh pattern in the mesh member 20. The words "mesh pattern" in the present specification mean that a plurality of tiny holes are uniformly arranged in the whole mesh member 20. For example, the words "mesh pattern" mean that a plurality of through holes are arranged in a grid pattern, a plurality of through holes are arranged in a staggered pattern, a plurality of through holes are regularly arranged, and a plurality of through holes are irregularly arranged. In the present embodiment, the plurality of through holes 25 are arranged in a staggered pattern. That is to say, groups of the plurality of through holes 25 that align along the axis A2 are arranged in a staggered pattern along the first axis A1. The mesh member 20 is formed as a sheet metal, for example.

The upper housing 7 has an exposed part (outside part) 7A that is behind the optical receptacle 4 and is exposed from the cage C, and an air intake part 7B that is at the exposed part 7A. Through the air intake part 7B, air is sucked into the internal space of the housing 2 from outside the housing 2. The exposed part 7A is exposed from the cage C when the optical transceiver 1 is inserted into the communication device until the optical transceiver 1 cannot be inserted further along the first axis A1. The exposed part 7A has slopes 7e each of which slopes upward (a direction in which the upper housing 7 protrudes) toward a front side (a side on which the optical receptacle 4 exists). Further, the exposed part 7A has flat surfaces 7f that extend from front sides of the respective slopes 7e along the first axis A1. An angle of inclination between each of the slopes 7e and the first axis A1 is smaller than or equal to 45°, for example.

The air intake part 7B includes the mesh members 20 and 30, and openings 7b and 6b to which the mesh members 20 and 30 are attached, respectively. The upper housing 7 has a plurality of grooves 7c on an external surface 7a of the upper housing 7. The plurality of grooves 7c extend rearward from the opening 7b along the first axis A1. The lower housing 6 has the opening 6b (see FIG. 2) to which the mesh member 30 is attached, similarly as the opening 7b. A shape of the opening 7b seen along the axis A3 is smaller than a shape of the mesh member 20 seen along the axis A3.

When the mesh member 20 is attached to the opening 7b, the mesh member 20 covers the whole opening 7b. The opening 7b is at a front side of the upper housing 7, is rectangular, and extends along the first axis A1. The mesh member 20 is attached to the opening 7b in a direction from an internal side that is opposite the external surface 7a to the external surface 7a. Part (a second platelike part 22 and a third platelike part 23 that will be described later) of the mesh member 20 attached to the opening 7b is exposed from the cage C (see FIG. 3).

The mesh member 20 has a first platelike part 21, the second platelike part 22, and the third platelike part 23. The first platelike part 21 is disposed to be flush with the external surface 7a of the upper housing 7. The second platelike part 22 is disposed in such a manner that the second platelike part 22 slopes from one of two ends of the first platelike part 21, and is flush with the slopes 7e. The third platelike part 23 is disposed to extend from a side of the second platelike part 22 that is opposite the first platelike part 21, and is flush with the flat surfaces 7f. For example, the first platelike part 21, the second platelike part 22, and the third platelike part 23 are each rectangular.

A first fixed part 24a extends from each of three end surfaces 21a of the first platelike part 21 that are not adjacent to the second platelike part 22. The first fixed parts 24a each have a platelike shape, and are fixed to the upper housing 7. A second fixed part 24b extends from an end surface 23a of the third platelike part 23. The end surface 23a of the third platelike part 23 faces along the first axis A1. The second fixed part 24b has a platelike shape, and is fixed to the upper housing 7. Each of the end surfaces 21a extends along the axis A3 between a top surface 20a of the mesh member 20 and corresponding one of the first fixed parts 24a, and forms a step between the top surface 20a and corresponding one of the first fixed parts 24a. The end surface 23a extends along the axis A3 between the top surface 20a and the second fixed part 24b, and forms a step between the top surface 20a and the second fixed part 24b.

The end surfaces 21a of the first platelike part 21 of the mesh member 20 are opposite (for example, are in contact with) an inner edge 7h of the opening 7b. End surfaces 22a of the second platelike part 22 of the mesh member 20 face along the axis A2, and are opposite (for example, are in contact with) the inner edge 7h of the opening 7b. End surfaces 23b of the third platelike part 23 of the mesh member 20 face along the axis A2, and are opposite (for example, are in contact with) the inner edge 7h of the opening 7b. The top surface 20a of the mesh member 20 is flush with the external surface 7a, the slopes 7e, and the flat surfaces 7f in a state where the first fixed parts 24a and the second fixed part 24b are in contact with and are fixed to an internal surface 7g of the upper housing 7 (see FIG. 8).

Figure 7:
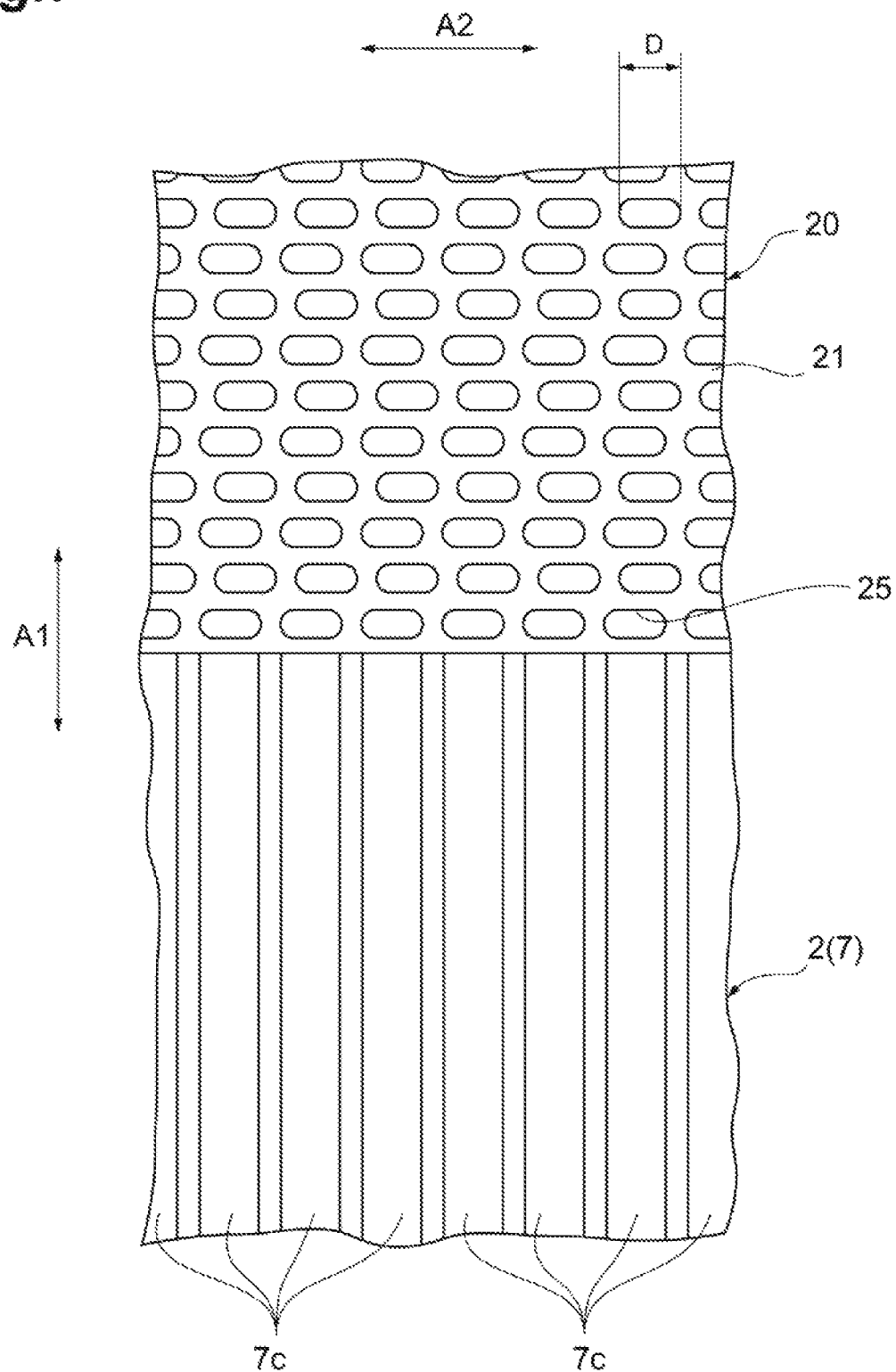
FIG. 7 is an enlarged top view of a plurality of through holes of the mesh member in FIG. 6 and grooves of an external surface of the housing in FIG. 6.

FIG. 7 is an enlarged top view of a rear side of the first platelike part 21 of the mesh member 20 and the grooves 7c of the upper housing 7. As illustrated in FIGS. 6 and 7, each of the through holes 25 of the mesh member 20 is elliptical and extends along the axis A2, for example. For example, a largest diameter (major axis) D of each of the plurality of through holes 25 is smaller than or equal to 20% of a wavelength of an electromagnetic wave generated within the optical transceiver 1. For example, if a frequency of the electromagnetic wave is 25 GHz, a wavelength of the electromagnetic wave is approximately 12 mm Therefore, a value of the diameter D is smaller than or equal to 2.4 mm. If a diameter D of each of the through holes is decreased, air can be sucked through the through holes, and dust and foreign bodies are less likely to enter the optical transceiver 1 through the mesh member 20. If a diameter D of each of the through holes is decreased, the number of the through holes is increased. Consequently, an area of all the through holes does not decrease, and thus air is easily sucked through the through holes.

The grooves 7c of the upper housing 7 and the respective through holes 25 that are at an end along the first axis A1 are opposite each other along the first axis A1. That is to say, positions of the through holes 25 that are at a rear end (an end that is close to the grooves 7c) and positions of the grooves 7c are the same along the axis A2. Therefore, when air flows out through the through holes 25 that are at the rear end, the air smoothly moves through the grooves 7c along the first axis A1.

Figure 8:
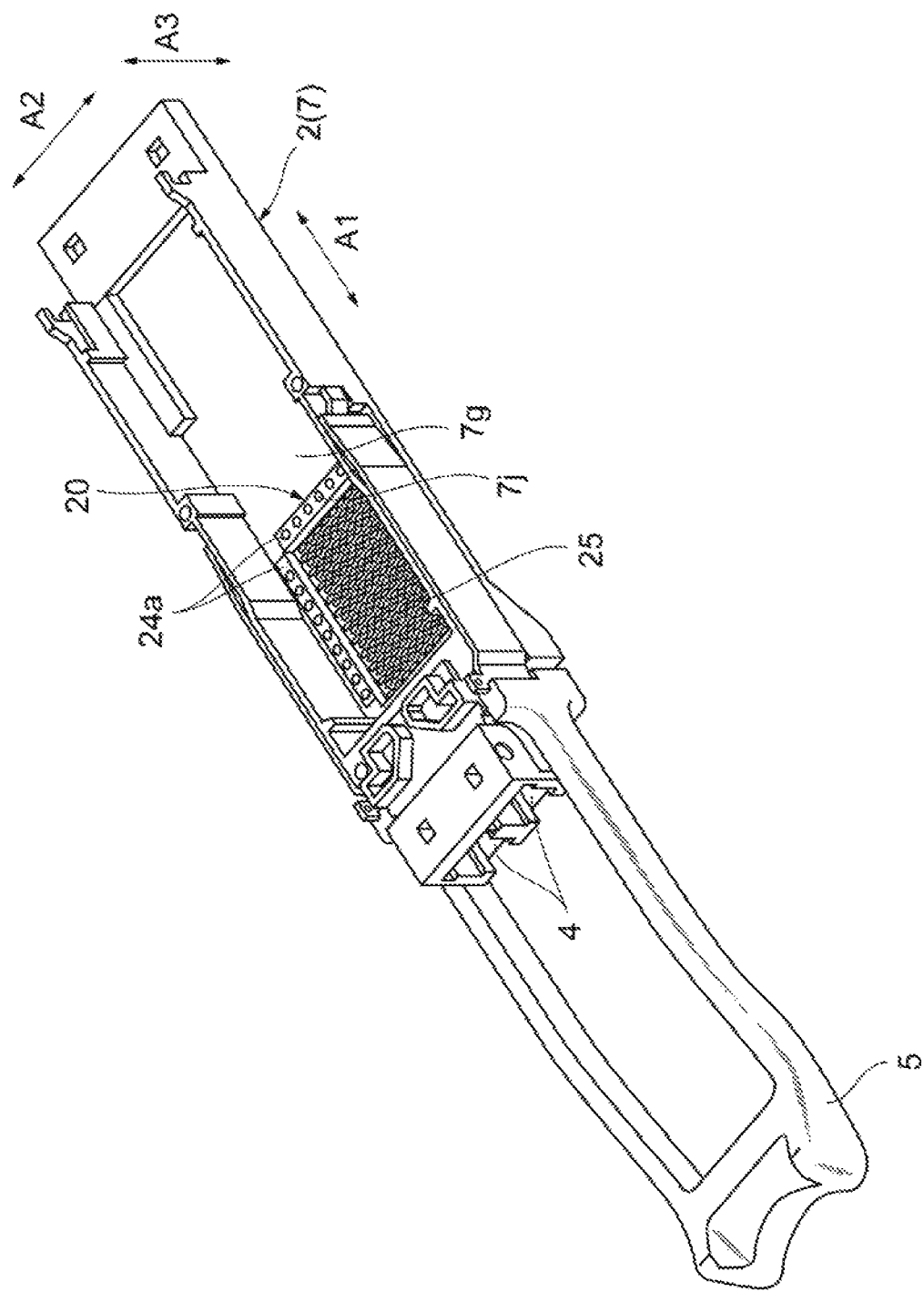
FIG. 8 is a perspective view of the housing and the mesh member in FIG. 6 that are seen from an internal side of the housing.
Figure 9:
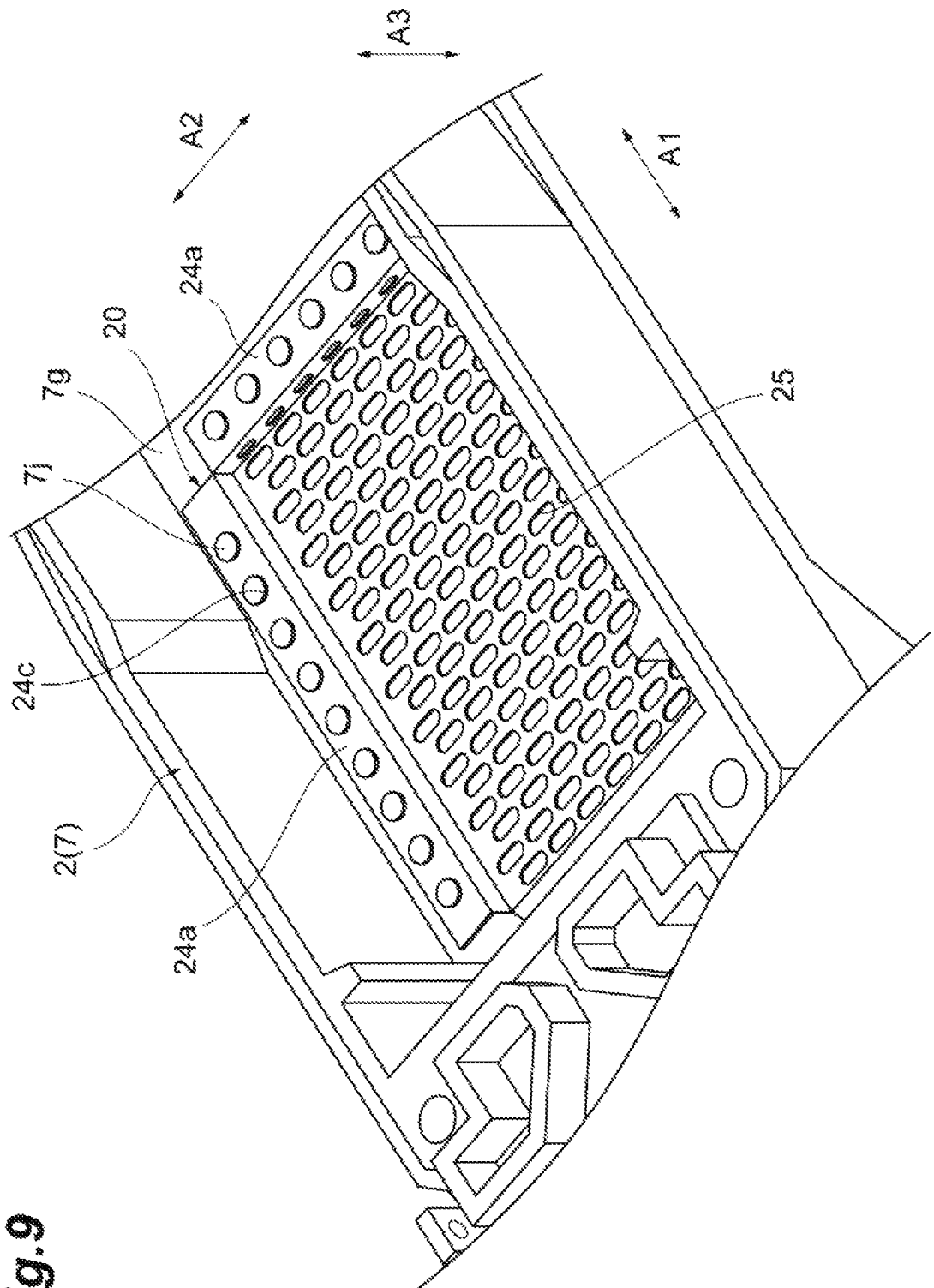
FIG. 9 is an enlarged perspective view of the mesh member in FIG. 8.

FIG. 8 is a perspective view that illustrates an internal surface 7g of the upper housing 7 that is opposite the external surface 7a, and the mesh member 20 attached to the internal surface 7g. FIG. 9 is an enlarged perspective view of the mesh member 20 in FIG. 8. The mesh member 20 is fitted into and fixed to the opening 7b at a front side of the upper housing 7. The first fixed parts 24a and the second fixed part 24b each have a plurality of through holes 24c. The internal surface 7g has a plurality of protrusions 7j.

The plurality of through holes 24c and the plurality of protrusions 7j are arranged along a lengthways axis of each of the first fixed parts 24a or a lengthways axis of the second fixed part 24b (along the first axis A1 or the axis A2). An arrangement of the protrusions 7j of the internal surface 7g corresponds to an arrangement of the through holes 24c of the first fixed parts 24a and an arrangement of the through holes 24c of the second fixed part 24b. The first fixed parts 24a and the second fixed part 24b are fixed to the internal surface 7g by fitting the protrusions 7j into the respective through holes 24c. For example, the through holes 24c are each circular, and the protrusions 7j are each cylindrical.

Figure 10:
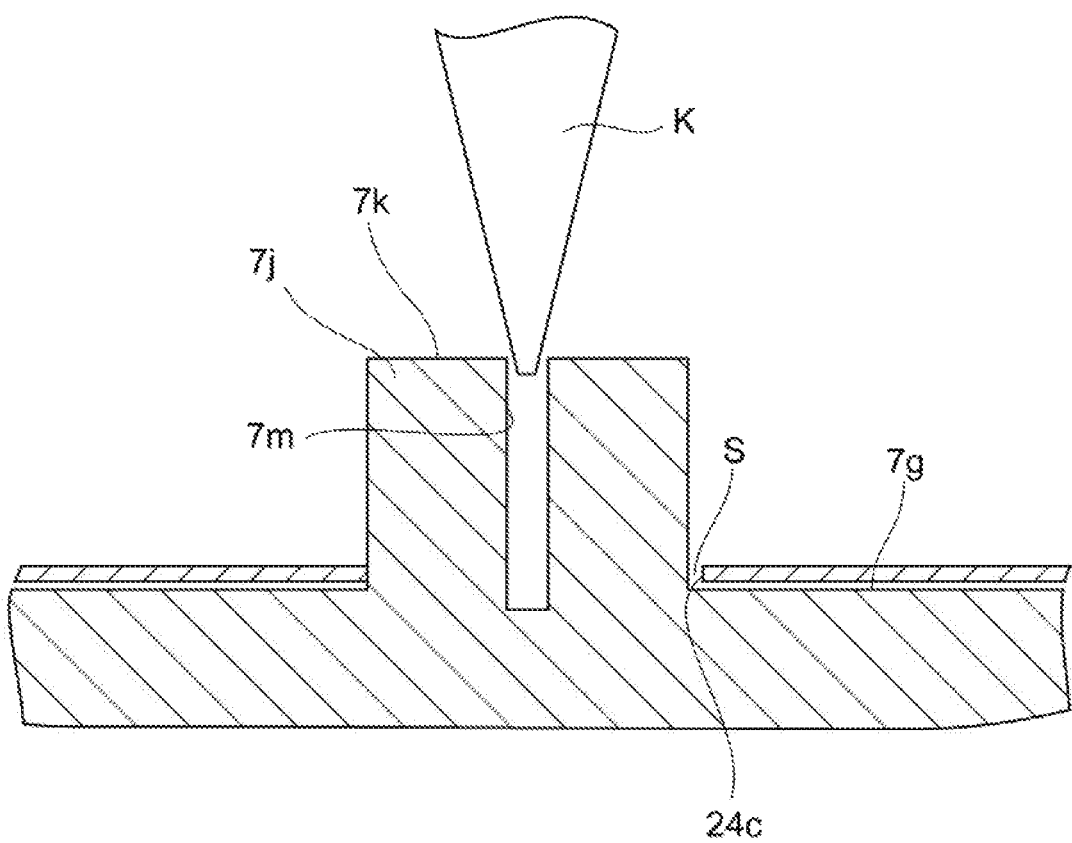
FIG. 10 is an enlarged vertical cross-sectional view of one of through holes of the mesh member in FIG. 8 and one of protrusions of the housing in FIG. 8.

FIG. 10 is an enlarged vertical cross-sectional view of one of the through holes 24c of the first fixed parts 24a (second fixed part 24b), and one of the protrusions 7j. As illustrated in FIG. 10, a diameter of the through hole 24c is larger than a diameter of the protrusion 7j. For example, a gap S that is larger than or equal to 20 μm and smaller than or equal to 40 μm is formed between an inner edge of the through hole 24c and a surface of the protrusion 7j. The protrusion 7j may have a slit 7m that extends downward from a top surface 7k of the protrusion 7j. A depth of the slit 7m may be deeper than a height of the internal surface 7g. For example, a rivet tool K is inserted into the slit 7m to widen the slit 7m and thus deform the protrusion 7j. Consequently, the protrusion 7j is more securely fixed to the through hole 24c.

Next, procedures will be described by which the mesh member 20 is attached to the upper housing 7, and thus the plurality of through holes 25 are provided for the housing 2. First, the upper housing 7 that has the opening 7b is prepared, as illustrated in FIGS. 6 and 8. The upper housing 7 is disposed in such a manner that the internal surface 7g of the upper housing 7 faces upward. The mesh member 20 with the top surface 20a of the mesh member 20 facing downward is disposed over the internal surface 7g. Then, the end surfaces 21a, the end surfaces 22a, the end surface 23a, and the end surfaces 23b of the mesh member 20 are fitted into the inner edge 7h of the opening 7b of the upper housing 7 in a direction from the internal surface 7g to the external surface 7a. Consequently, the first fixed parts 24a and the second fixed part 24b are fixed to the internal surface 7g.

When the first fixed parts 24a and the second fixed part 24b are fixed to the internal surface 7g, the protrusions 7j of the internal surface 7g are fitted into the through holes 24c of each of the first fixed parts 24a and the through holes 24c of the second fixed part 24b. As described above, each of the protrusions 7j may have the slit 7m. In this case, after the protrusions 7j are fitted into the respective through holes 24c, the slits 7m are widened with the rivet tool K, and thus the protrusions 7j are deformed. Consequently, the protrusions 7j are securely fixed to the respective through holes 24c. As described above, the first fixed parts 24a and the second fixed part 24b are fixed to the internal surface 7g by fitting the protrusions 7j into the respective through holes 24c. Consequently, the mesh member 20 is attached to the upper housing 7. Further, the plurality of through holes 25 are provided for the housing 2.

Figure 11:
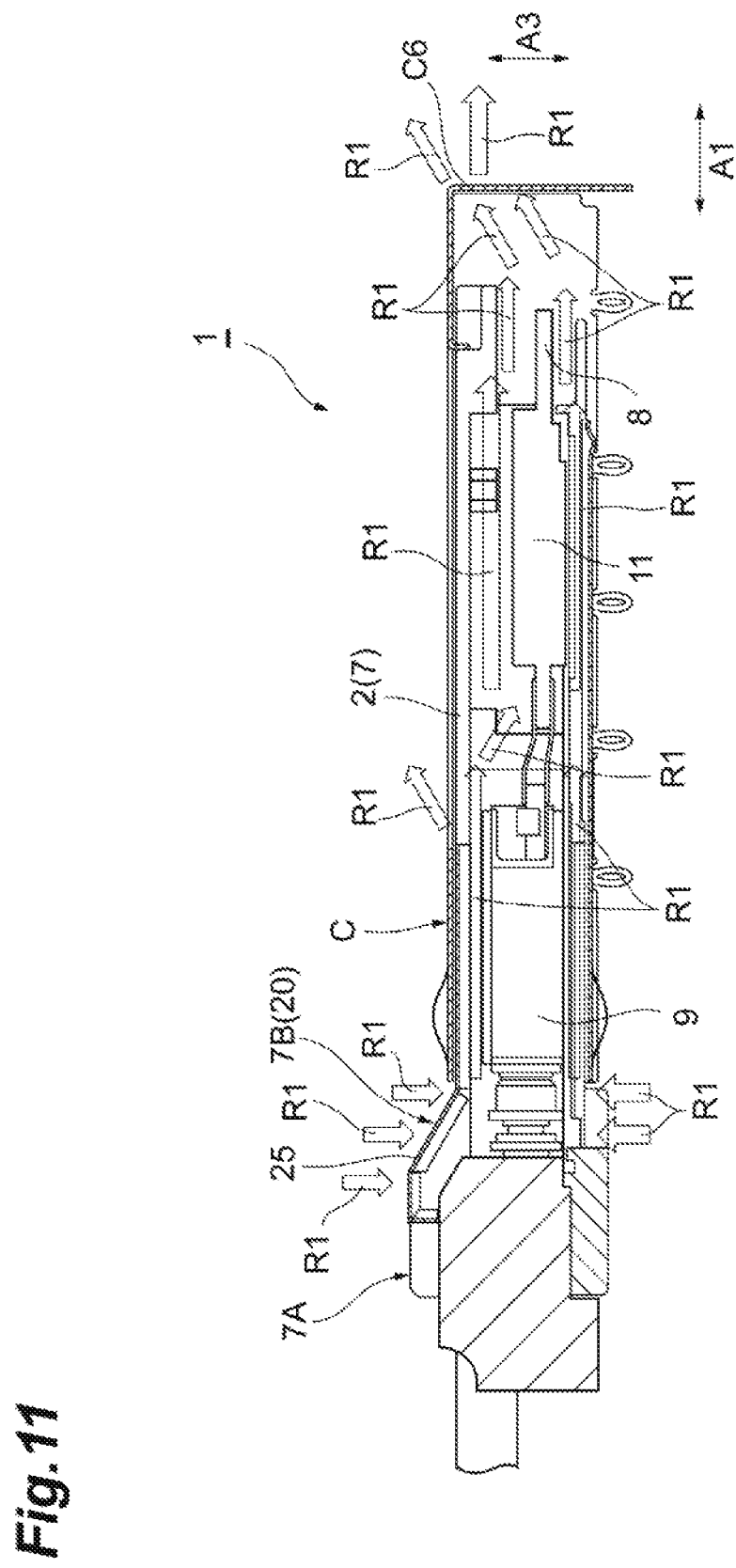
FIG. 11 is a drawing that schematically illustrates air flow within the optical transceiver in FIG. 1.
Figure 12:
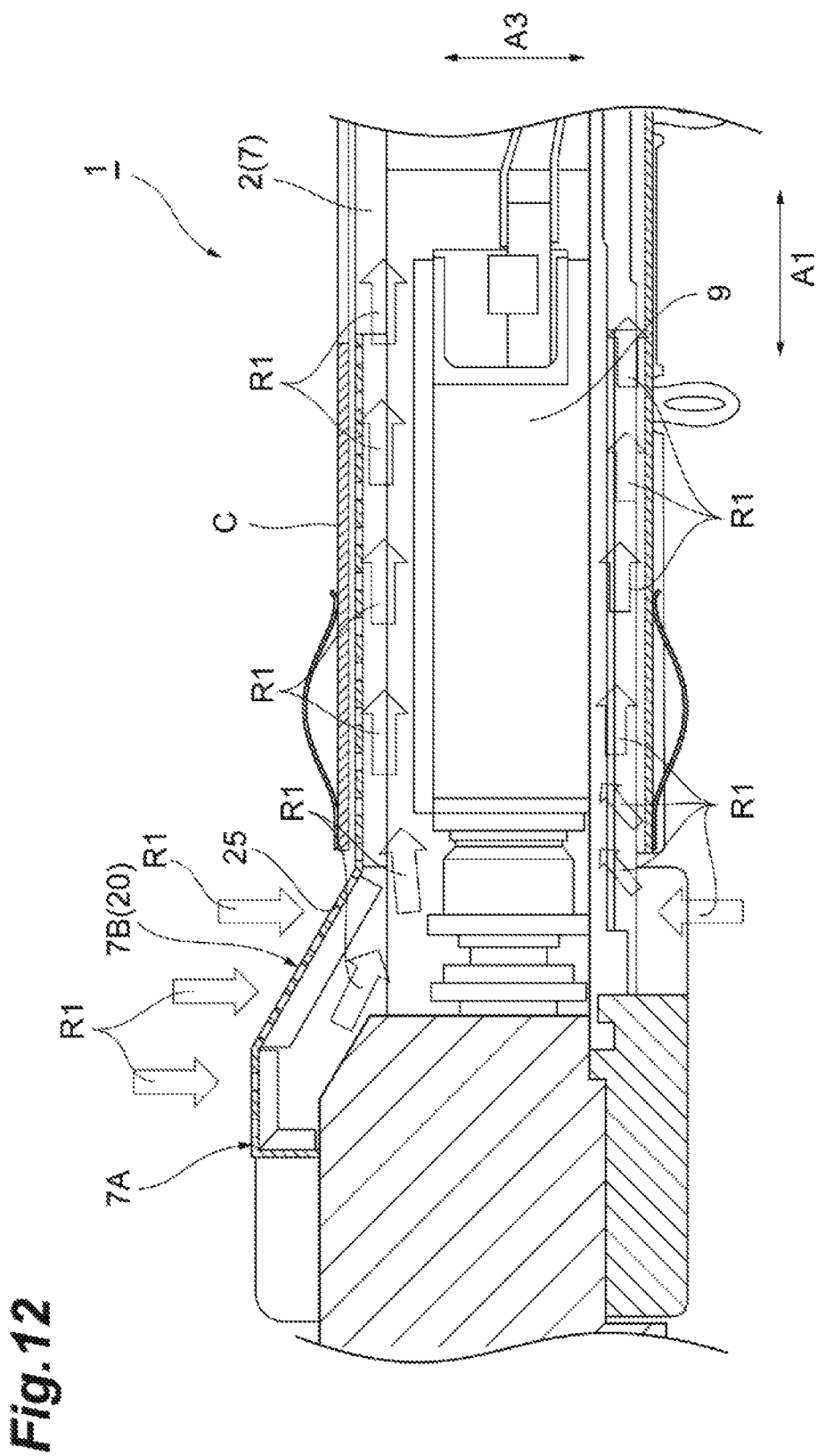
FIG. 12 is an enlarged partial cross-sectional view of an optical sub-assembly and other components of the optical transceiver in FIG. 11.

Next, effects of the optical transceiver 1 according to the present embodiment will be described in detail. As illustrated in FIGS. 11 and 12, the housing 2 of the optical transceiver 1 has the exposed part 7A and the air intake part 7B. The exposed part 7A is exposed from the cage C when the housing 2 is inserted into the cage C of the communication device until the housing 2 cannot be inserted further into the cage C along the first axis A1 (the housing 2 is engaged with the cage C). The air intake part 7B is at the exposed part 7A. Through the air intake part 7B, air R1 is sucked into the internal space of the housing 2 from outside the housing 2.

Therefore, when the housing 2 is inserted into the cage C until the housing 2 cannot be inserted further into the cage C along the first axis A1 (the housing 2 is engaged with the cage C), the exposed part 7A of the housing 2 is exposed from the cage C. Further, the exposed part 7A has the air intake part 7B. Therefore, the air R1 flows through the air intake part 7B into the internal space of the housing 2. Therefore, the air R1 flows directly to heat sources (e.g. heat generating devices) housed in the internal space of the housing 2. Therefore, the heat sources in the internal space of the housing 2 are efficiently cooled.

Therefore, the heat sources (devices), such as the TOSA 9, the ROSA 10, and circuits, such as a circuit for clock data recovery (CDR), of the circuit board 11 within the housing 2 are efficiently cooled. More specifically, the above fan of the communication device generates air flow that sucks air into through the receiving opening of the cage C. Consequently, the air R1 is sucked into the housing 2 through the air intake part 7B (the plurality of through holes 25 of the mesh member 20 and the plurality of through holes 25 of the mesh member 30). The air R1 that has been sucked into flows into the cage C and flows through a top, a bottom, and sides of the TOSA 9, and a top, a bottom, and sides of the ROSA 10. Consequently, the air R1 directly cools the TOSA 9 and the ROSA 10.

Part of the air R1 that passes through the tops of the TOSA 9 and the ROSA 10 flows out from the housing 2 through the air intake part 7B. The air that has flowed out flows through the plurality of grooves 7c of the upper housing 7 along the first axis A1. The air R1 that passes through the tops, the bottoms, and the sides of the TOSA 9 and the ROSA 10 flows through a top and a bottom of the circuit board 11. Therefore, the air R1 directly cools circuits of the circuit board 11.

The air R1 that flows backward through the circuit board 11 reaches the electrical plug 8 and a rear end of the cage C, and flows (into the communication device) out from the cage C through a plurality of through holes (air outlet part) C6 at the rear end of the cage C. As described above, the air R1 sucked into the housing 2 through the air intake part 7B of the housing 2 flows along the TOSA 9, the ROSA 10, and the circuit board 11. Therefore, an inside of the optical transceiver 1 is more efficiently cooled. That is to say, the air intake part 7B and the air outlet part C6 allow air that has been sucked into the housing 2 to flow through the internal space. The air flow effectively cools the devices.

The housing 2 may have the opening 7b. The air intake part 7B of the housing 2 may include the mesh member 20 that has a platelike shape and has the plurality of mesh-pattern through holes 25. The mesh member 20 is attached to the opening 7b of the housing 2. In this case, in a state where the housing 2 is inserted in the cage C, the plurality of mesh-pattern through holes 25 of the housing 2 are exposed from the cage C. Since the plurality of through holes 25 are tiny, a leakage of electromagnetic waves to the outside the housing 2 is suppressed.

Therefore, a leakage of electromagnetic waves to the outside of the optical transceiver 1 is suppressed, and thus electromagnetic compatibility (EMC) is dealt with. The mesh member 20 that has a platelike shape and has the plurality of through holes 25 is attached to the opening 7b of the housing 2. Consequently, the housing 2 has the plurality of mesh-pattern through holes 25. Therefore, since the mesh member 20 has been preliminarily prepared, a plurality of through holes do not need to be made through the housing 2. The plurality of through holes 25 are easily provided for the housing 2 by attaching the mesh member 20 to the opening 7b of the housing 2.

A largest diameter D of each of the plurality of mesh-pattern through holes 25 may be smaller than or equal to 20% of a wavelength of an electromagnetic wave generated within the housing 2. In this case, the housing 2 is efficiently cooled by air R1 sucked into the internal space of the housing 2 through the plurality of through holes 25. Further, the largest diameter D of each of the plurality of through holes 25 is smaller than or equal to 20% of a wavelength of an electromagnetic wave. Therefore, a leakage of the electromagnetic wave is surely suppressed.

More specifically, Formula 3 is obtained from the following Formulas 1 and 2 that each show radiation conductance from a through hole (radiation power in a case where a voltage applied to the through hole is 1V).

[Math. 1]

$$\frac{\eta}{\lambda} G_a \approx \frac{2}{\pi} \left(\frac{a}{\lambda}\right)^2 \quad (1)$$

[Math. 2]

$$\frac{\eta}{\lambda} = \frac{\omega \mu}{2\pi} \quad (2)$$

[Math. 3]

$$G_a = \frac{4}{\omega \mu} \left(\frac{a}{\lambda}\right)^2 \quad (3)$$

Ga described above is conductance (reciprocal of resistance), and is a value normalized by power that is input when a voltage applied is set as 1V. Therefore, a unit of Ga is dimensionless. Suppose that an operating frequency of an electromagnetic wave is 25 GHz. In this case, $\omega = 2\pi \times 25 \times 10^9$ (Hz) and $\mu = 4\pi \times 10^{-7}$ H/m, based on Formula 3. Further, suppose that $(a/\lambda) = 0.2$ (a diameter of the through hole is 20% of the wavelength). In this case, the following Formula 4 is obtained.

[Math. 4]

$$G_a = \frac{4}{2\pi \times 25 \times 10^9 \cdot 4\pi \times 10^7} 0.2^2 \approx 8.10 \times 10^{-7} \quad (4)$$

From Formula 4, Formula 5 is obtained.

[Math. 5]

$$10 \times \log(G_a) = -61 \text{ dB} \quad (5)$$

Therefore, if a largest diameter D of each of the through holes 25 is 20% of a wavelength of an operating frequency, a quantity of electromagnetic wave that is transmitted by the through holes 25 is very small, and thus causes no problem. Further, the above formulas are for a unit slit, and are different from formulas for a plurality of through holes arranged in a mesh pattern. However, it is thought that the above formulas are also practically applicable to a plurality of through holes arranged in a mesh pattern. To process higher-frequency signals that have a higher operating frequency, the devices such as the TOSA 9, the ROSA 10, and the circuit for CDR consume more electrical energy, and thus generate more heat (Joule heating). The above electromagnetic wave is generated by high-frequency signals processed by the devices.

The housing 2 may have the plurality of grooves 7c that extend from the opening 7b of the housing 2 along the first axis A1. In this case, air R1 flows through the plurality of grooves 7c. Consequently, the air R1 efficiently cools the housing 2 and thus cools heat of the internal space of the housing 2.

The plurality of grooves 7c and the plurality of respective mesh-pattern through holes 25 that are at an end along the first axis A1 may be opposite each other along the first axis A1. In this case, the grooves 7c and the respective through holes 25 are opposite each other along the first axis A1. Therefore, when the air R1 that flows out or into through the through holes 25 flows along the first axis A1, the air R1 efficiently flows through the grooves 7c. Therefore, the air R1 efficiently flows along the first axis A1. Therefore, the heat sources (devices) within the internal space of the optical transceiver 1 are further efficiently cooled.

Second Embodiment

Figure 13:
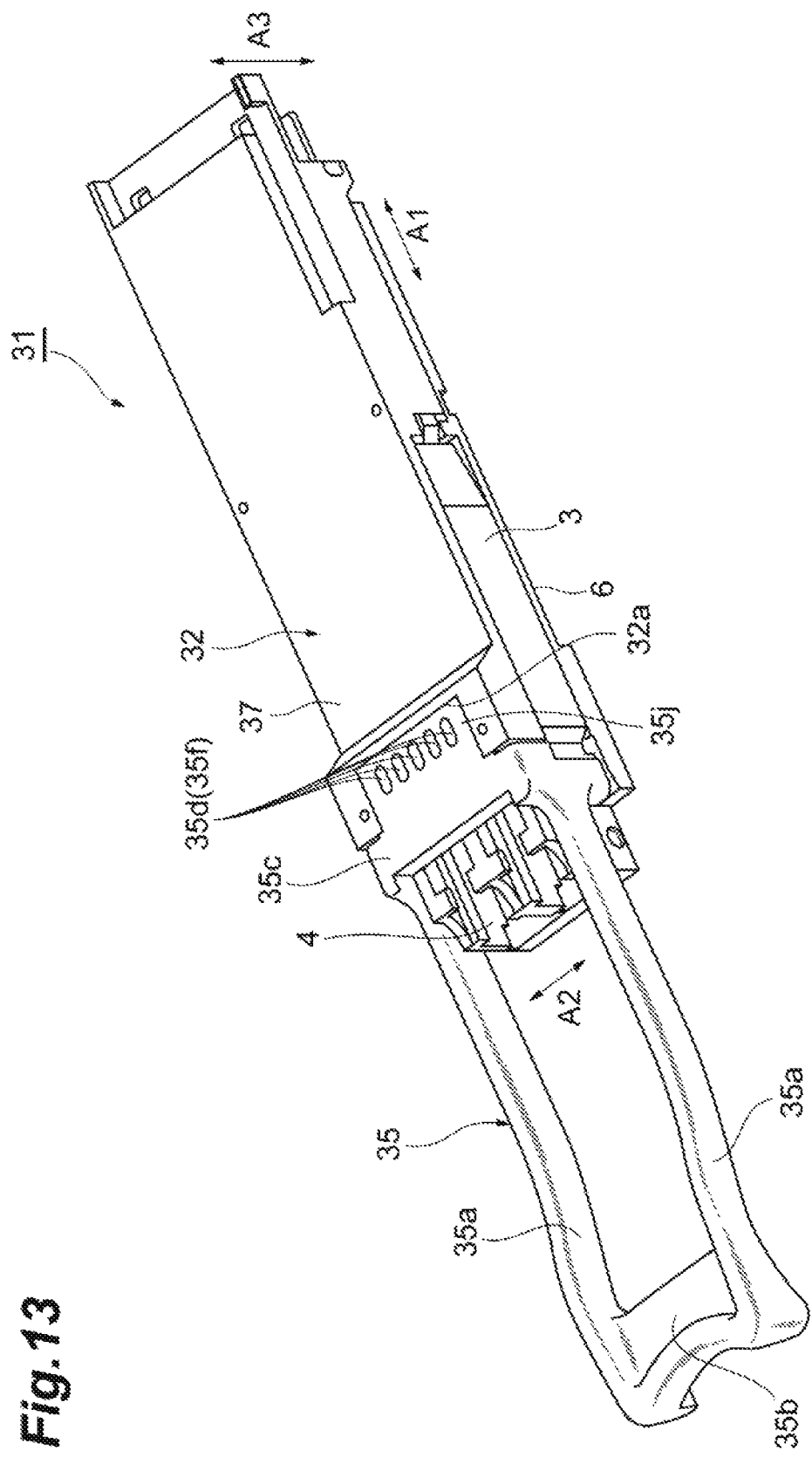
FIG. 13 is a perspective view that illustrates an optical transceiver according to a second embodiment of the present disclosure.
Figure 14:
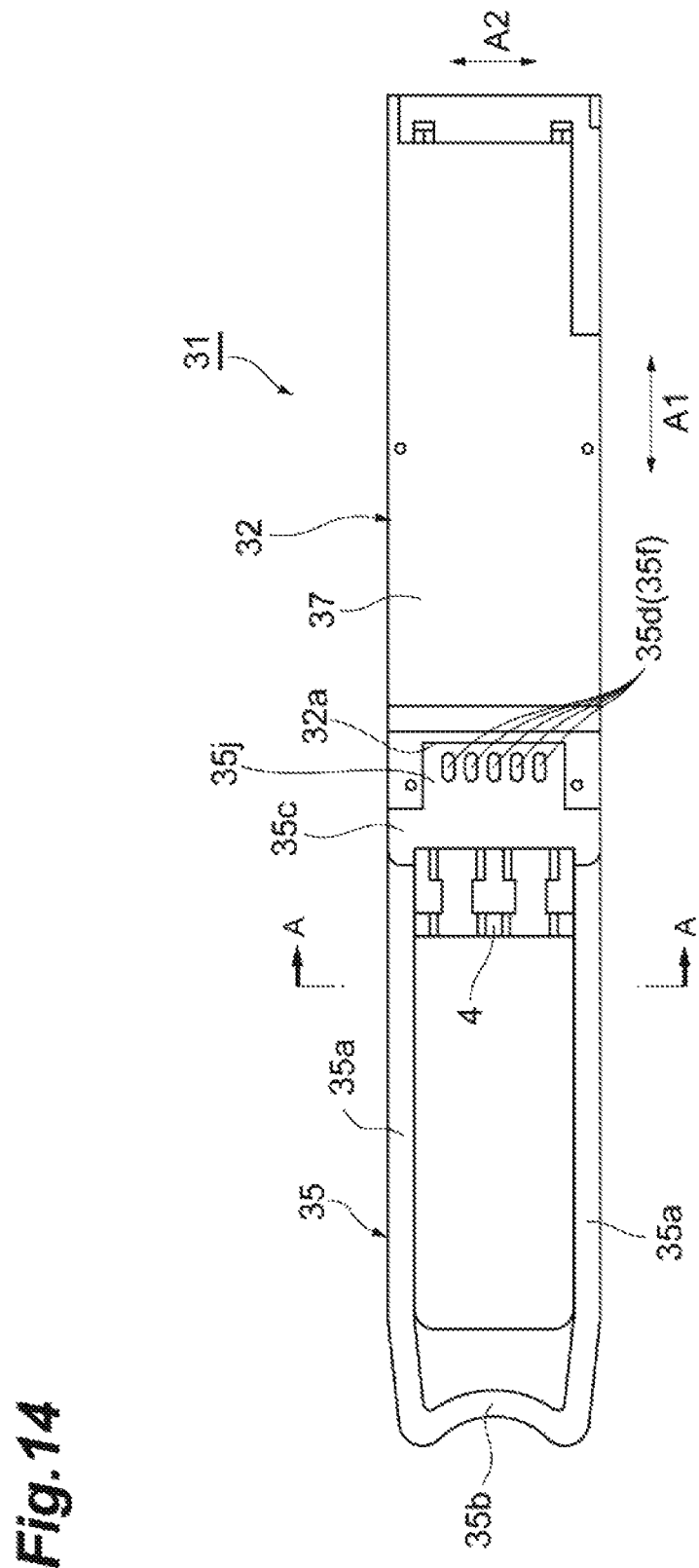
FIG. 14 is a top view of the optical transceiver in FIG. 13.

Next, an optical transceiver 31 according to a second embodiment will be described. FIG. 13 is a perspective view that illustrates the optical transceiver 31. FIG. 14 is a top view that illustrates the optical transceiver 31. As illustrated in FIGS. 13 and 14, differences between the optical transceiver 31 and the optical transceiver according to the first embodiment are a configuration of a housing 32 and a configuration of a handle 35. In the following explanations, what has been explained in the first embodiment appropriately will not be explained to avoid redundancy. The housing 32 includes a lower housing 6 and an upper housing 37 that is opposite the lower housing 6. Sliders 3 are between the lower housing 6 and the upper housing 37.

Figure 15:
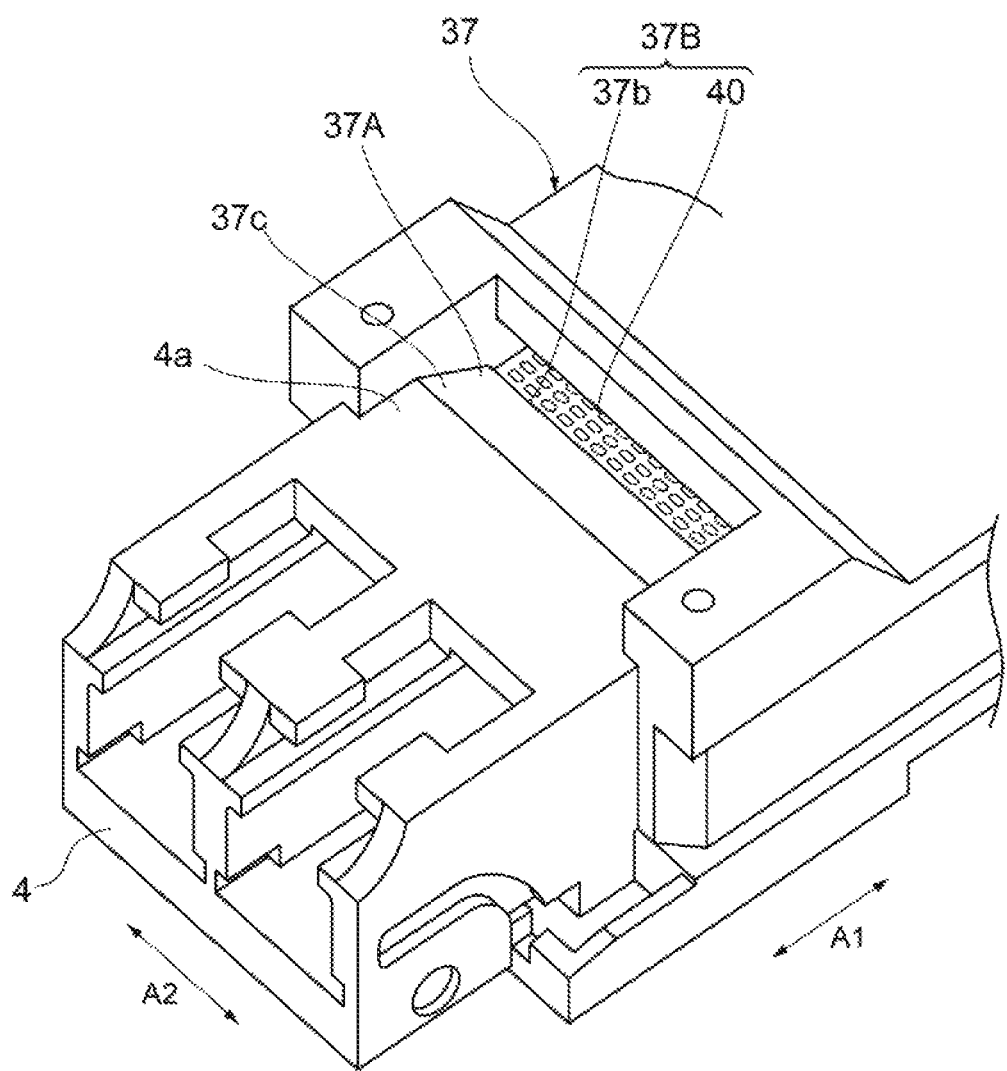
FIG. 15 is a perspective view that illustrates an air intake part of a housing of the optical transceiver in FIG. 13.

FIG. 15 is a perspective view that illustrates an end of the upper housing 37 that extends along a first axis A1. In FIG. 15, the handle 35 is removed from the upper housing 37. As illustrated in FIG. 15, the upper housing 37 has an exposed part 37A and an air intake part 37B. The exposed part 37A is exposed from a cage C when the optical transceiver 31 is inserted into a communication device until the optical transceiver 31 cannot be inserted further into the communication device along the first axis A1. The air intake part 37B is at the exposed part 37A. Through the air intake part 37B, air is sucked into an internal space of the optical transceiver 31 from outside the optical transceiver 31. The air intake part 37B includes an opening 37b that is rectangular and extends along both the first axis A1 and an axis A2. Further, the air intake part 37B includes a mesh member 40 attached to the opening 37b. For example, the opening 37b extends through a portion of a slope 37c that is close to the cage C. The slope 37c slopes downward from a top surface 4a of an optical receptacle 4. The optical receptacle 4 is opposite the handle 35.

Figure 16:
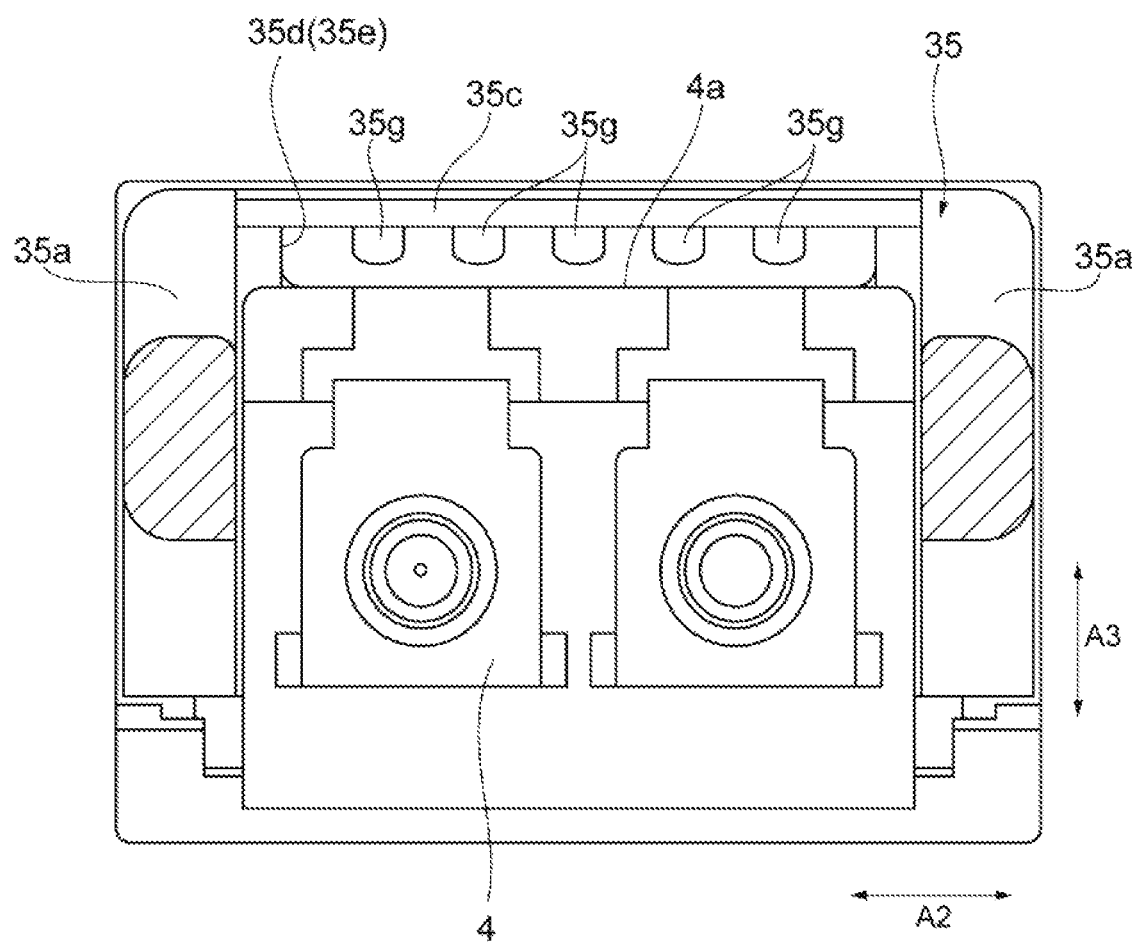
FIG. 16 is a cross-sectional view taken along line A-A in FIG. 14.

FIG. 16 is a cross-sectional view taken along line A-A in FIG. 14, or is a cross-section view of the handle 35 taken along a plane that is perpendicular to the first axis A1. As illustrated in FIGS. 14 and 16, the handle 35 has a pair of arms 35a that each extend along the first axis A1, and a first connector 35b that connects the pair of arms 35a with each other, and is opposite the housing 32. Further, the handle 35 has a second connector 35c that is opposite the first connector 35*b*, connects the pair of arms 35*a* with each other, and is opposite the top surface 4*a* of the optical receptacle 4.

The arms 35*a* and the first connector 35*b* are pinched with fingers, for example. While the arms 35*a* or the first connector 35*b* is pinched, the handle 35 is pulled in a direction away from the cage C. Consequently, the optical transceiver 31 is pulled out from the cage C. The handle 35 has air-intake through holes 35*d* through which air is sucked into the internal space of the optical transceiver 31 from outside the optical transceiver 31. The air-intake through holes 35*d* cover the air intake part 37B of the housing 32.

The air-intake through holes 35*d* include a first air-intake through hole 35*e* formed between, for example, the second connector 35*c*, the pair of arms 35*a*, and the top surface 4*a* of the optical receptacle 4. Further, the air-intake through holes 35*d* include second air-intake through holes 35*f* that extend through the second connector 35*c* along an axis A3. The first air-intake through hole 35*e* faces the first axis A1. Air is sucked into the internal space of the optical transceiver 31 through the first air-intake through hole 35*e* along the first axis A1. The second connector 35*c* has a plurality of protrusions 35*g* that protrude into the first air-intake through hole 35*e*. For example, the plurality of protrusions 35*g* align along the axis A2. Since the plurality of protrusions 35*g* align along the axis A2 in this way, air is smoothly sucked into spaces between the plurality of protrusions 35*g*.

As illustrated in FIGS. 13 and 14, the second connector 35*c* has a projection 35*j* that enters a recess 32*a* of the housing 32 that is recessed along the first axis A1. The recess 32*a* and the projection 35*j* are each rectangular, for example. For example, the second air-intake through holes 35*f* are provided at the projection 35*j* and extend through the projection 35*j* along the axis A3. For example, the second air-intake through holes 35*f* are each elliptical and extend along the first axis A1. Further, the plurality of second air-intake through holes 35*f* align along the axis A2.

Figure 17:
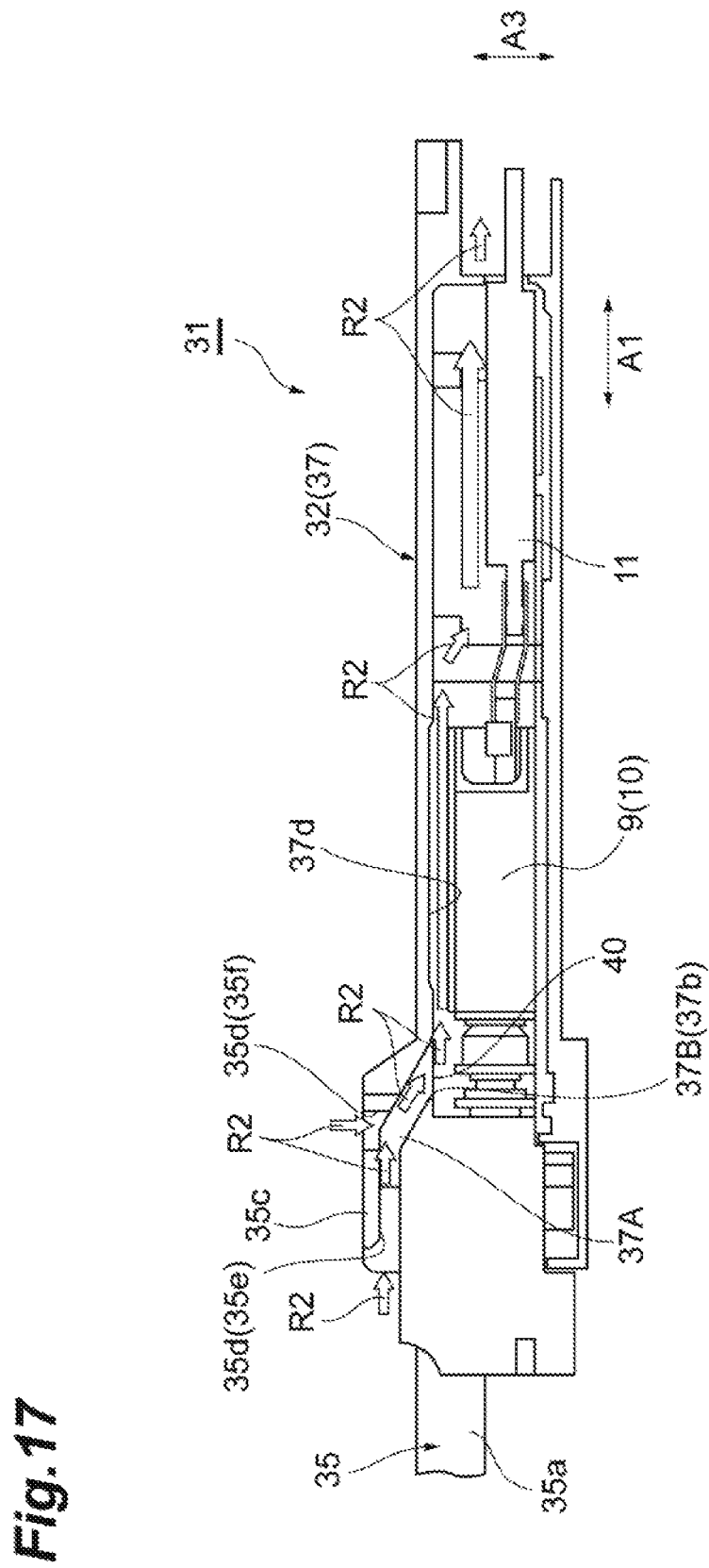
FIG. 17 is a drawing that schematically illustrates air flow within the optical transceiver in FIG. 13.

As illustrated in FIG. 17, the housing 32 has the opening 37*b*, and the handle 35 has the first air-intake through hole 35*e* and the second air-intake through holes 35E Therefore, air R2 is sucked into the optical transceiver 31, and flows through the optical transceiver 31 along the first axis A1. In the internal space of the optical transceiver 31, the air R2 flows directly to heat sources, such as a TOSA 9, a ROSA 10, and circuits of a circuit board 11, and flows through the heat sources, such as the TOSA 9, the ROSA 10, and the circuit board 11.

Figure 18:
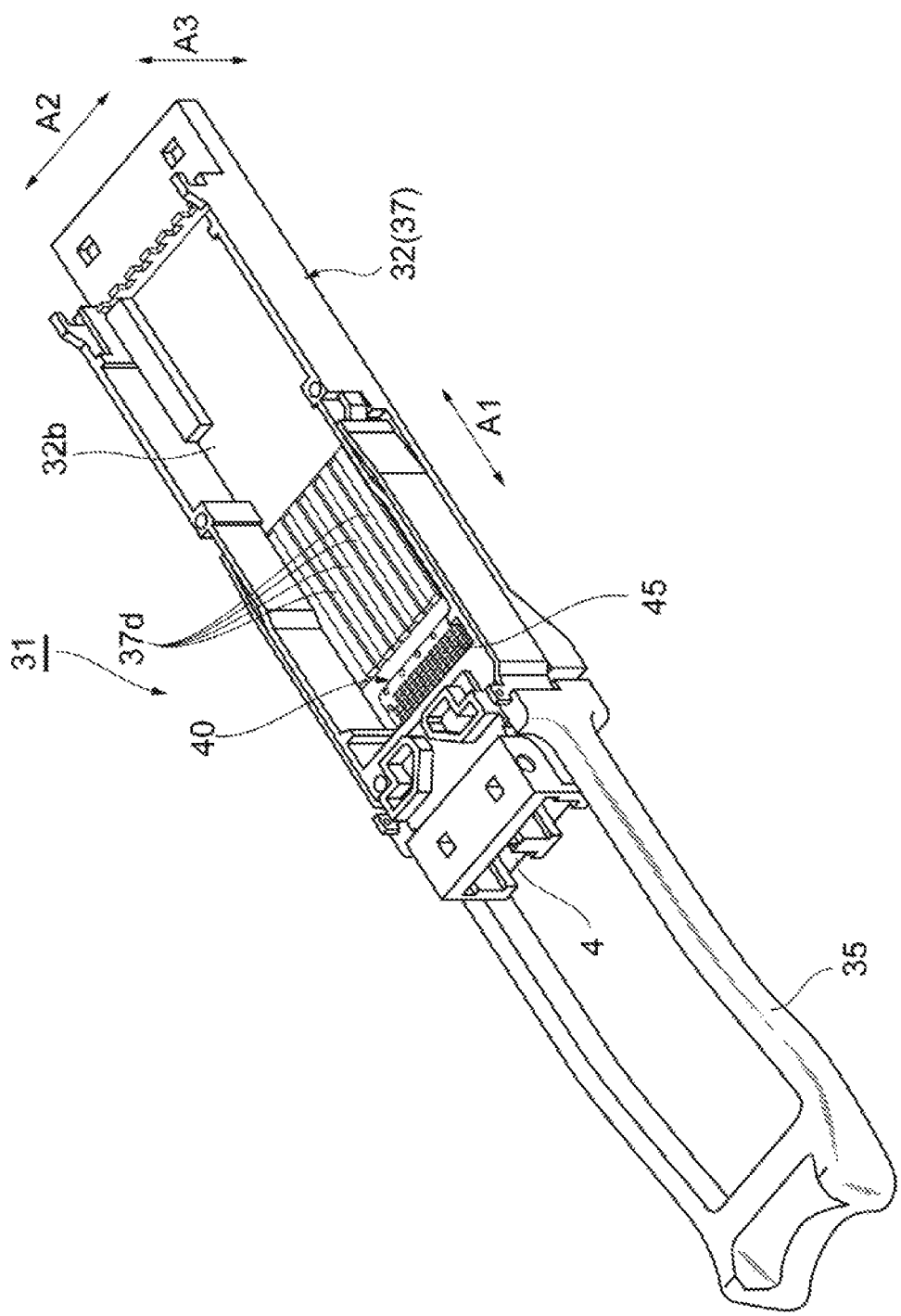
FIG. 18 is a perspective view of the housing and a mesh member in FIG. 13 that are seen from an internal side of the housing.
Figure 19:
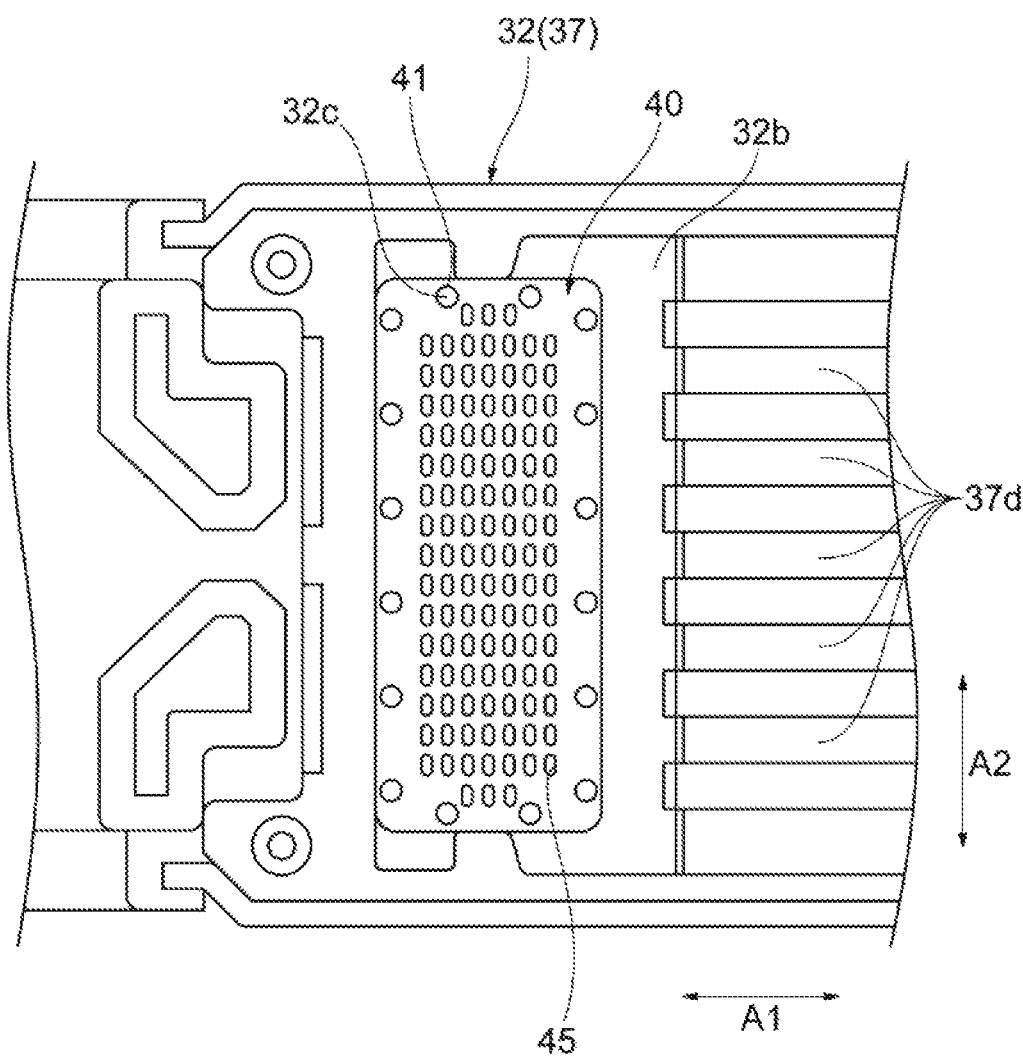
FIG. 19 is a top view that illustrates the mesh member in FIG. 18 and grooves.

FIG. 18 is a perspective view that illustrates an internal surface 32*b* of the housing 32 (upper housing 37) and the mesh member 40. FIG. 19 is an enlarged top view of the mesh member 40 and the internal surface 32*b*. As illustrated in FIGS. 18 and 19, the mesh member 40 is attached to the internal surface 32*b* of the housing 32. For example, the mesh member 40 is rectangular, and its corners are rounded. The mesh member 40 has a plurality of through holes 41 arranged along a periphery of the mesh member 40. The plurality of through holes 41 are fitted onto respective protrusions 32*c* on the internal surface 32*b*. Consequently, the mesh member 40 is attached to the internal surface 32*b*. Configurations of the protrusions 32*c* and the through holes 41 may be the same as configurations of the protrusions 7*j* and the through holes 24*c*.

The mesh member 40 has a plurality of through holes 45 that constitute the above air intake part 37B. For example, the through holes 45 are each elliptical and extend along the axis A2, similarly as the above through holes 25. The plurality of through holes 45 are arranged in a grid pattern along both the first axis A1 and the axis A2. The upper housing 37 has a plurality of grooves 37*d* that are closer to the cage C than the mesh member 40. The plurality of grooves 37*d* are each recessed along a third axis D3 and extend along the first axis A1. Air flows into the housing 32 through the mesh member 40, and then moves smoothly through the plurality of grooves 37*d* along the first axis A1.

As described above, the optical transceiver 31 according to the second embodiment further includes the handle 35 attached to the exposed part 37A of the housing 32, as illustrated in FIG. 17, for example. The handle 35 has the air-intake through holes 35*d* through which air is sucked from an outside. The air-intake through holes 35*d* cover the air intake part 37B. Air R2 is sucked from an outside into the housing 32 through the air-intake through holes 35*d* of the handle 35 and through the air intake part 37B of the housing 32.

The air-intake through holes 35*d* of the handle 35 cover the air intake part 37B of the housing 32. Further, the air R2 is sucked into the internal space of the housing 32 through the air-intake through holes 35*d* of the handle 35 and through the air intake part 37B of the housing 32. Therefore, heat sources such as the TOSA 9, the ROSA 10, and circuits such as a circuit for clock data recovery (CDR), of the circuit board 11 within the housing 32 are efficiently cooled. Therefore, an effect similar to the effect of the first embodiment is obtained.

The optical transceiver 31 includes the handle 35 that has the air-intake through holes 35*d*. The handle 35 is held when the optical transceiver 31 is inserted into or removed from the cage C. Therefore, the handle 35 functions as a component through which the air R2 is sucked into the internal space of the housing 32. The handle 35 has the first air-intake through hole 35*e* that opens in the first axis A1, and the second air-intake through holes 35*f* that opens in the axis A3. Therefore, the air R2 is sucked into the housing 32 along the two axes. Therefore, the housing 32 is more effectively cooled.

Third Embodiment

Figure 20:
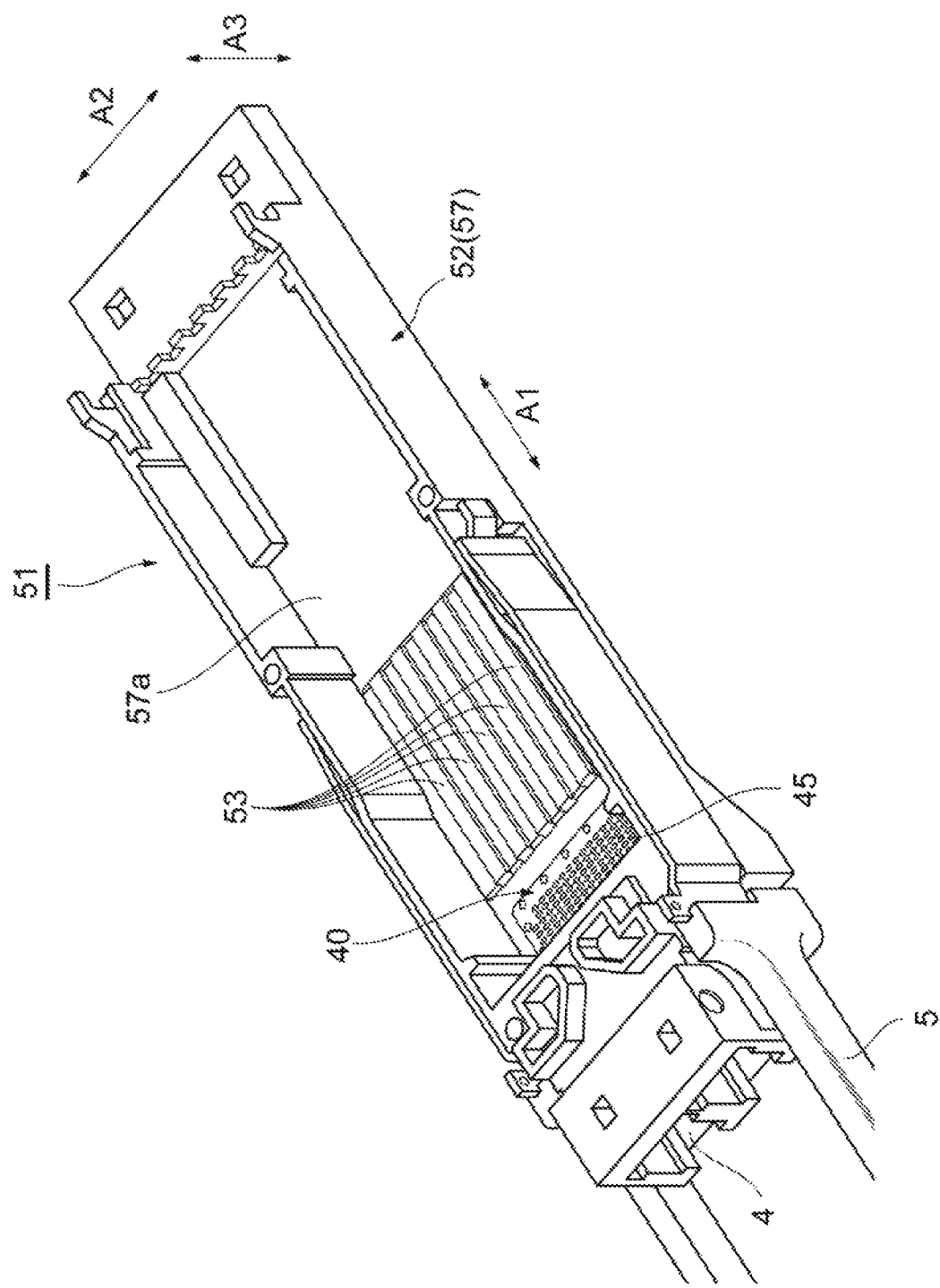
FIG. 20 is a perspective view of a housing, a mesh member, and grooves of an optical transceiver according to a third embodiment that are seen from an internal side of the housing.
Figure 21:
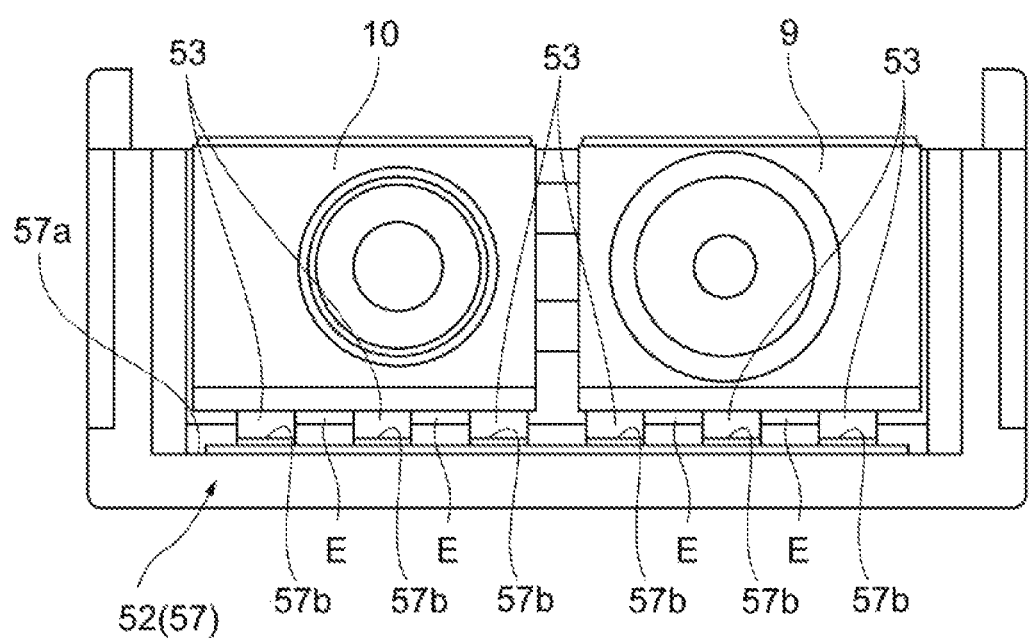
FIG. 21 is a drawing that illustrates the grooves in FIG. 20.

Next, an optical transceiver 51 according to a third embodiment will be described with reference to FIGS. 20 and 21. Differences between the optical transceiver 51 and the optical transceiver according to each of the above embodiments are a configuration of a housing 52 (upper housing 57) and addition of heat dissipating sheets 53. The optical transceiver 51 includes the plurality of heat dissipating sheets 53 that extend along a first axis A1. Each of the plurality of heat dissipating sheets 53 is a strip, for example.

The housing 52 has a plurality of grooves 57*b* on an internal surface 57*a* of the housing 52. The plurality of grooves 57*b* are closer to a cage C than a mesh member 40 is. The heat dissipating sheets 53 are arranged in the plurality of respective grooves 57*b*. A height of each of the heat dissipating sheets 53 in the internal surface 57*a* is higher than part of the internal surface 57*a* that does not have the grooves 57*b*. Top surfaces of the heat dissipating sheets 53 are in contact with a TOSA 9 and a ROSA 10.

In the optical transceiver 51 according to the third embodiment, air R2 is sucked into an internal space of the housing 52 through the mesh member 40, similarly as the above second embodiment. In the internal space of the optical transceiver 51, the air R2 flows directly to heat sources, such as the TOSA 9, the ROSA 10, and circuits of a circuit board 11. Therefore, an effect similar to the effect of each of the above embodiments is obtained. Further, the optical transceiver 51 according to the third embodiment includes the plurality of heat dissipating sheets 53 that extend along the first axis A1. The TOSA 9 and the ROSA 10 are arranged on the plurality of heat dissipating sheets 53. Therefore, the air R2 flows through spaces E along the first axis A1. Each of the spaces E is defined by a pair of the heat dissipating sheets 53, the internal surface 57a of the housing 52, and the TOSA 9 or the ROSA 10. Therefore, the TOSA 9 and the ROSA 10 are more efficiently cooled. Further, the TOSA 9 and the ROSA 10 are in contact with the internal surface 57a with the heat dissipating sheets 53 interposed therebetween. Therefore, more heat is dissipated from the TOSA 9 and the ROSA 10 to outside the housing 52.

The optical transceivers according to the embodiments of the present disclosure have been described above. However, the present invention is not limited to the above embodiments. That is to say, a person skilled in the art easily recognizes that the present invention are variously changed and modified within a scope of a spirit disclosed in the claims. For example, shapes, sizes, numbers, materials, and arrangements of parts of the optical transceivers are appropriately changed within a scope of the spirit.

For example, in the above embodiments, an example is explained in which the protrusions 7j are fitted into the respective through holes 24c. Consequently, the first fixed parts 24a and the second fixed part 24b are fixed to the internal surface 7g, and thus the mesh member 20 is attached to the housing 2. However, configurations and methods for attaching the mesh member to the housing are not limited to the above example but may be appropriately modified. For example, the mesh member may be attached to the housing with an adhesive or screws.

In the above embodiments, an example is explained in which the upper housing 7 has the grooves 7c on the external surface 7a of the upper housing 7. Further the grooves 7c extend rearward from the opening 7b along the first axis A1. However, shapes of the grooves, sizes of the grooves, the number of the grooves, and arrangements of the grooves may be appropriately modified. Further, the grooves may be eliminated. Further, the lower housing 6 may have grooves similar to the grooves 7c.

In the above embodiments, an example has been explained in which the mesh member 20 is attached to the housing 2, and thus the housing 2 has the plurality of mesh-pattern through holes 25. However, a plurality of mesh-pattern through holes may be directly made through the housing. In this case, the mesh member may be eliminated.

In the above embodiments, the optical transceiver 1 complying with the specifications for SFP has been explained. However, an optical transceiver according to the present invention may not comply with the specifications for SFP, but may comply with other specifications, such as specifications for quad small form-factor pluggable (QSFP).

What is claimed is:

1. An optical transceiver configured to be inserted to and extracted from a cage of an apparatus along a first direction, the optical transceiver comprising:
   a device generating heat;
   a housing having a rectangular parallelepiped shape with long sides extending along the first direction, the housing including:
      an internal space housing the device; and
      an outside part configured to be exposed to an outside of the cage, when the housing is engaged with the cage, the outside part having an air intake part configured to bring an outside air into the internal space for cooling the device; and
   a handle attached to the outside part,
   wherein the handle covers the air intake part and has intake holes on an outer face,
   wherein the handle leads the outside air from the intake holes to the air intake part.

2. The optical transceiver according to claim 1, wherein the air intake part has mesh-like through holes, each through hole bringing the outside air into the internal space and preventing a dust from entering the internal space.

3. The optical transceiver according to claim 2, wherein the air intake part includes a mesh member having a platelike shape and the mesh-like through holes, and
   wherein the mesh member is attached to an opening of the housing.

4. The optical transceiver according to claim 3, wherein the mesh member is formed as a sheet metal.

5. The optical transceiver according to claim 2, wherein each of the through holes has a diameter smaller than 20% of a wavelength of an electromagnetic wave generated in the internal space.

6. The optical transceiver according to claim 5, wherein the electromagnetic wave is caused by a high frequency electrical signal handled by the device.

7. The optical transceiver according to claim 1, wherein the housing has a plurality of grooves each extending along the first direction,
   wherein each of the grooves allows an intake air sucked through the air intake part to flow from the air intake part therethrough.

8. The optical transceiver according to claim 7, wherein the grooves has respective ends aligned with mesh-like through holes in a direction crossing with the first direction.

9. The optical transceiver according to claim 1, wherein the housing further has an outlet part, and
   wherein the air intake part and the outlet part allow an intake air to strongly flow along the first direction through the internal space between the device and the inner surface of the housing for efficiently cooling the device.

* * * * *